(12) United States Patent
Hashimoto et al.

(10) Patent No.: US 10,566,469 B2
(45) Date of Patent: Feb. 18, 2020

(54) METHOD OF MANUFACTURING SOLAR CELL MODULE

(71) Applicant: Panasonic Intellectual Property Management Co., Ltd., Osaka (JP)

(72) Inventors: Haruhisa Hashimoto, Osaka (JP); Youhei Murakami, Osaka (JP); Akimichi Maekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 150 days.

(21) Appl. No.: 15/469,961

(22) Filed: Mar. 27, 2017

(65) Prior Publication Data

US 2017/0288069 A1 Oct. 5, 2017

(30) Foreign Application Priority Data

Mar. 29, 2016 (JP) ................................. 2016-065493
Sep. 30, 2016 (JP) ................................. 2016-194729

(51) Int. Cl.
*H01L 31/05* (2014.01)
*H01L 31/18* (2006.01)
*H01L 31/0216* (2014.01)
*H01L 31/056* (2014.01)
*H01L 31/054* (2014.01)

(52) U.S. Cl.
CPC ...... *H01L 31/02168* (2013.01); *H01L 31/056* (2014.12); *H01L 31/0547* (2014.12); *H01L 31/18* (2013.01); *H01L 31/188* (2013.01); *H01L 31/1876* (2013.01); *Y02E 10/52* (2013.01); *Y02P 70/521* (2015.11)

(58) Field of Classification Search
None
See application file for complete search history.

(56) References Cited

U.S. PATENT DOCUMENTS 5,439,161 A * 8/1995 Kawatani .......... H01L 21/67138
228/180.21
5,593,532 A * 1/1997 Falk .................. B32B 17/10788
136/251

(Continued)

FOREIGN PATENT DOCUMENTS

JP 2014-183289 A 9/2014
WO 99/056317 A1 11/1999

*Primary Examiner* — Devang R Patel
(74) *Attorney, Agent, or Firm* — McDermott Will & Emery LLP

(57) ABSTRACT

A method of manufacturing a solar cell module includes: placing a light reflection member across a gap between adjacent two solar cells set on a work table; and attaching the light reflection member to respective ends of the adjacent two solar cells, by thermocompression-bonding respective overlap regions of the light reflection member with the adjacent two solar cells using a compression bonding head that includes: a first thermocompression bonding portion and a second thermocompression bonding portion each having a contact surface that comes into contact with the light reflection member; and a non-thermocompression bonding portion interposed between the first thermocompression bonding portion and the second thermocompression bonding portion and not thermocompression-bonding the light reflection member.

13 Claims, 21 Drawing Sheets

(56) References Cited

U.S. PATENT DOCUMENTS

| | | | | |
|---|---|---|---|---|
| 5,698,068 A * | 12/1997 | Ichikawa | ............... | B29C 65/18 |
| | | | | 100/320 |
| 5,994,641 A * | 11/1999 | Kardauskas | ......... | H01L 31/048 |
| | | | | 136/246 |
| 6,481,482 B1 * | 11/2002 | Shimotomai | ........... | B32B 17/06 |
| | | | | 100/322 |
| 7,537,670 B2 * | 5/2009 | Takeyama | ............... | B32B 37/10 |
| | | | | 156/212 |
| 8,191,599 B2 * | 6/2012 | Meisser | ................... | B30B 1/34 |
| | | | | 156/382 |
| 2004/0248336 A1 * | 12/2004 | Shimizu | .......... | H01L 31/022425 |
| | | | | 438/57 |
| 2008/0035274 A1 * | 2/2008 | Kanisawa | ................ | B30B 5/02 |
| | | | | 156/583.1 |
| 2012/0240985 A1 * | 9/2012 | Hashimoto | ......... | H01L 31/0508 |
| | | | | 136/251 |
| 2013/0210186 A1 * | 8/2013 | Hiraike | ................ | B32B 27/304 |
| | | | | 438/64 |
| 2013/0333743 A1 * | 12/2013 | Ishii | ............... | H01L 31/022441 |
| | | | | 136/244 |
| 2014/0144482 A1 * | 5/2014 | Ishimaru | ................ | H01L 31/05 |
| | | | | 136/244 |
| 2016/0268964 A1 * | 9/2016 | Maekawa | ............... | H02S 40/22 |

* cited by examiner

METHOD OF MANUFACTURING SOLAR CELL MODULE

CROSS REFERENCE TO RELATED APPLICATION

This application claims the benefit of priority of Japanese Patent Application Number 2016-065493 filed on Mar. 29, 2016, and Japanese Patent Application Number 2016-194729 filed on Sep. 30, 2016, the entire contents of which are hereby incorporated by reference.

BACKGROUND

1. Technical Field

The present disclosure relates to a method of manufacturing a solar cell module.

2. Description of the Related Art

A solar cell module in which adjacent solar cells are spaced and fixed by a fixing member (an example of a light reflection member) attached across both solar cells has been conventionally known (for example, see Japanese Unexamined Patent Application Publication No. 2014-183289).

SUMMARY

The conventional solar cell module may require a pressure application step and a heating step when attaching the light reflection member to the solar cells. The solar cell module manufacturing process may include a heating step and a pressure application step when connecting wiring to the solar cells or when sealing the solar cells with a sealing material such as resin. The solar cell module manufacturing process also includes a step of conveying the components being manufactured between the aforementioned steps. It is therefore desirable that the heating and pressure application steps when attaching the light reflection member to the solar cells does not interfere with the other manufacturing steps.

The present disclosure has an object of providing a method of manufacturing a solar cell module that can prevent the light reflection member attachment step from interfering with the series of manufacturing steps and prevent damage to solar cell strings.

To achieve the stated object, a method of manufacturing a solar cell module according to one aspect of the present disclosure includes: placing a light reflection member across a gap between adjacent two solar cells set on a work table; and attaching the light reflection member to respective ends of the adjacent two solar cells, by thermocompression-bonding respective overlap regions of the light reflection member with the adjacent two solar cells using a compression bonding head that includes: two thermocompression bonding portions each having a contact surface that comes into contact with the light reflection member; and a non-thermocompression bonding portion interposed between the two thermocompression bonding portions and not thermocompression-bonding the light reflection member.

According to one aspect of the present disclosure, it is possible to prevent the light reflection member attachment step from interfering with the series of manufacturing steps and prevent damage to solar cell strings.

BRIEF DESCRIPTION OF DRAWINGS

The figures depict one or more implementations in accordance with the present teaching, by way of examples only, not by way of limitations. In the figures, like reference numerals refer to the same or similar elements.

Figure 5:
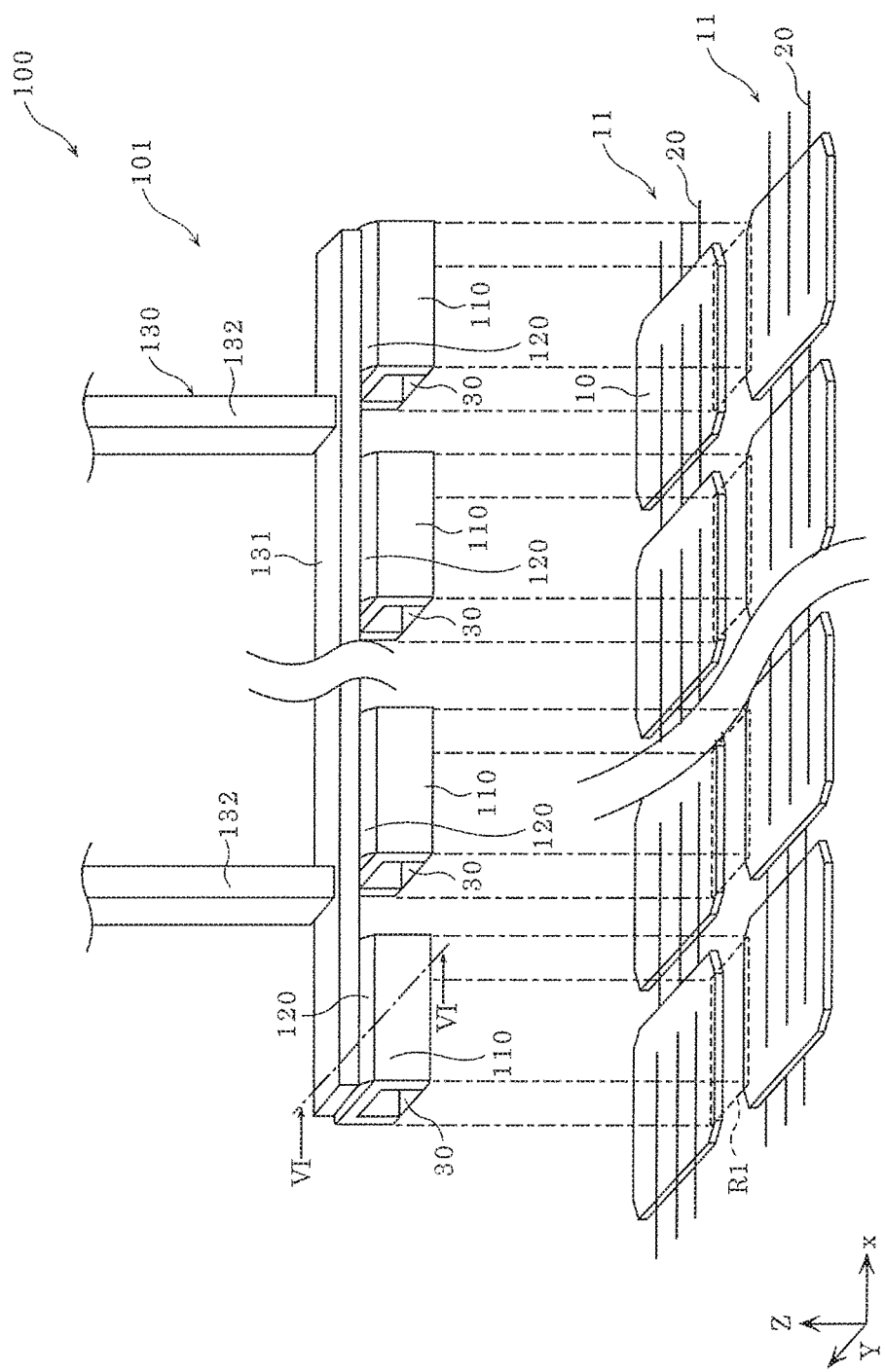
FIG. 5 is a perspective view of a compression bonding device and solar cell strings according to Embodiment 1.
Figure 9:
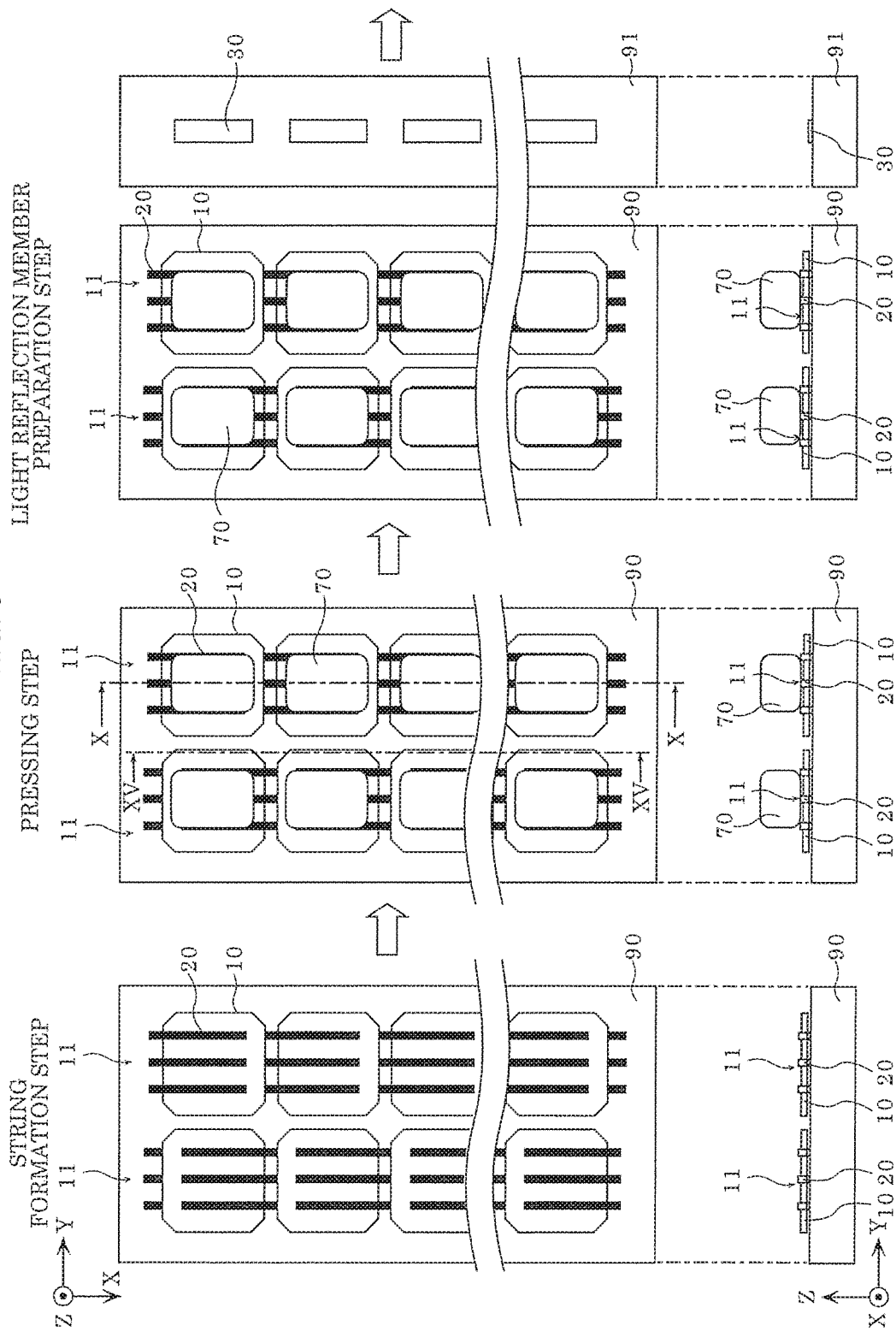
FIG. 9 is an explanatory diagram illustrating a string formation step and a pressing step in the method of manufacturing a solar cell module according to Embodiment 1.
Figure 10:
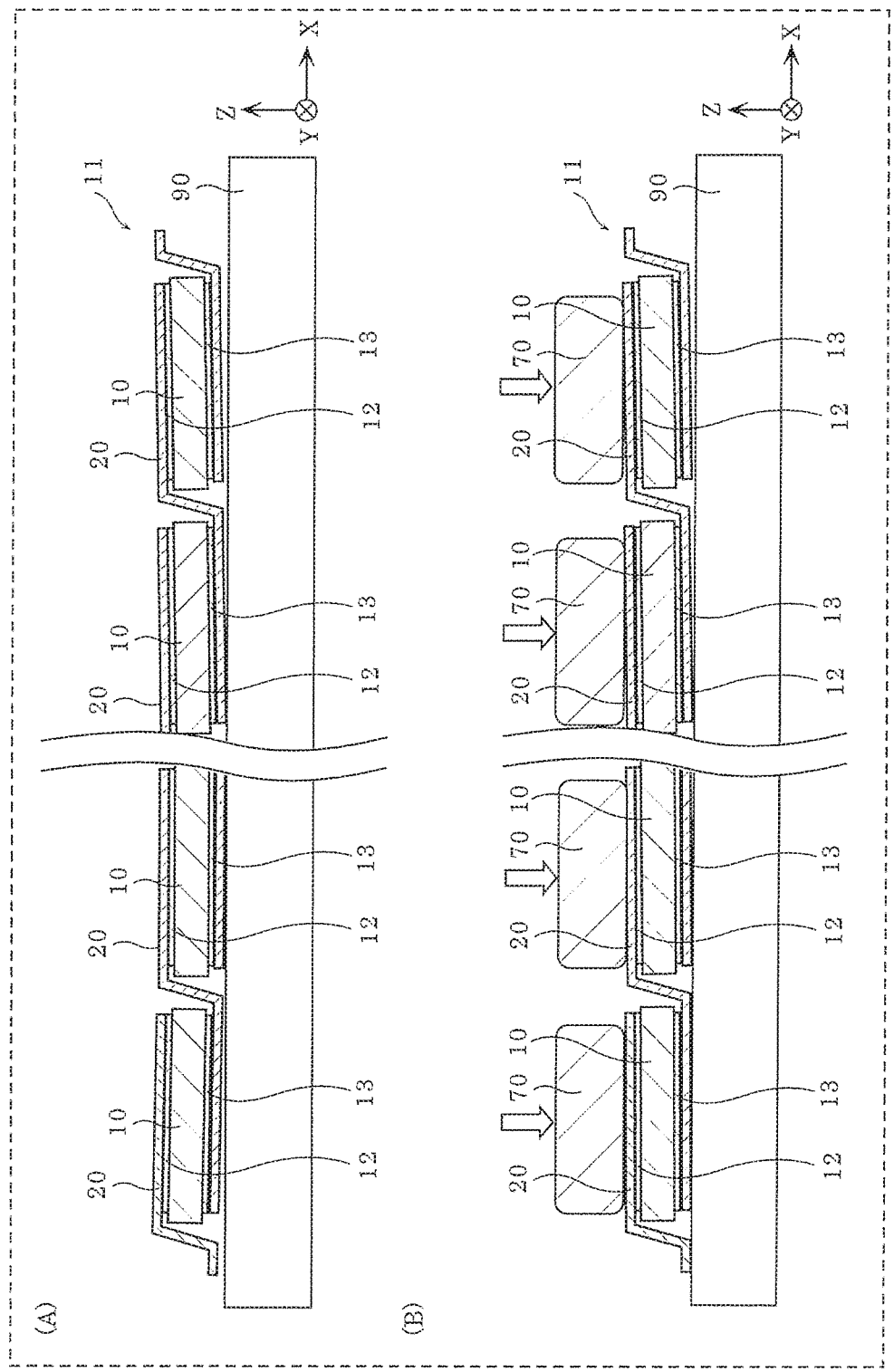
Figure 11:
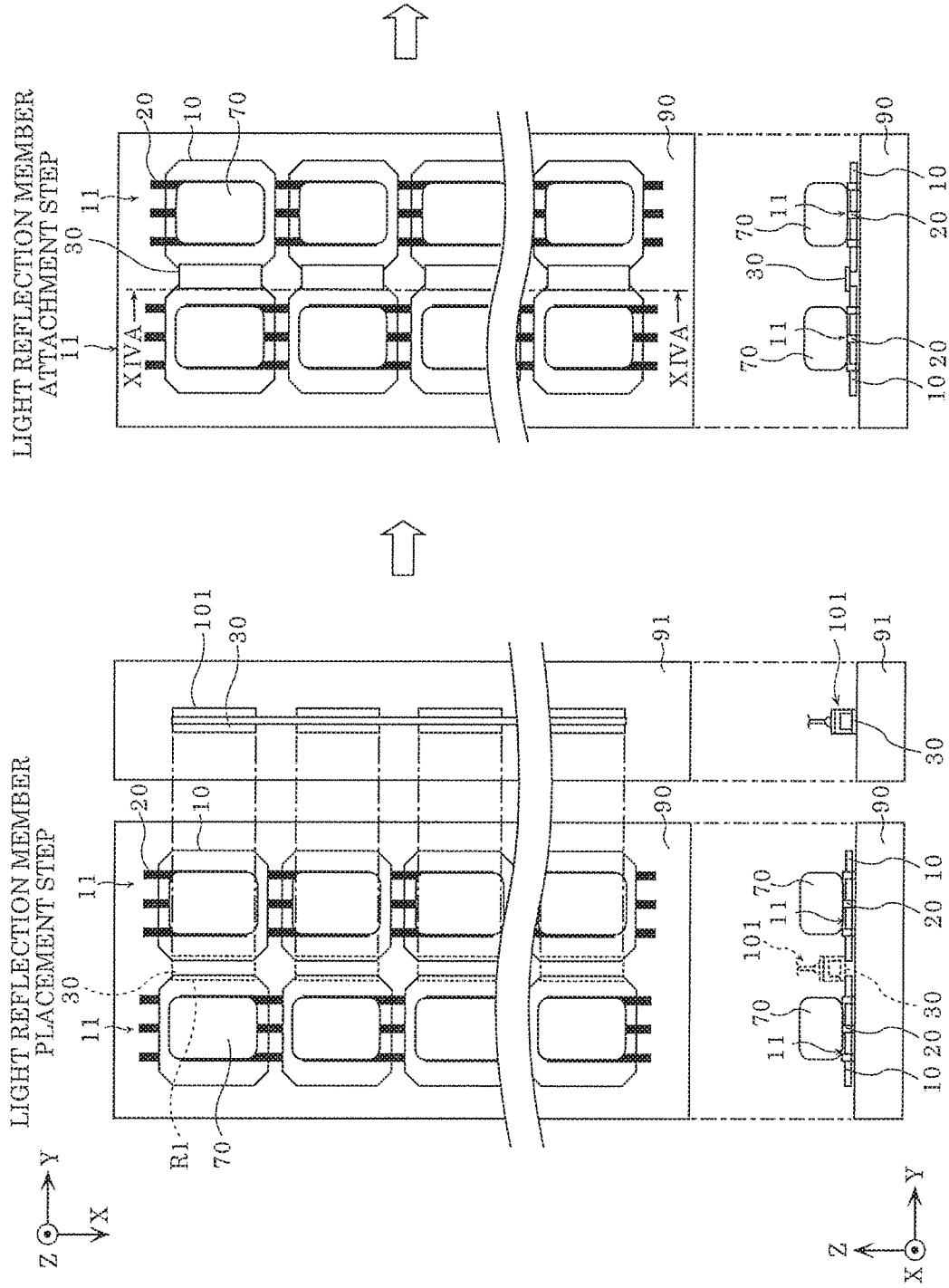
Figure 12:
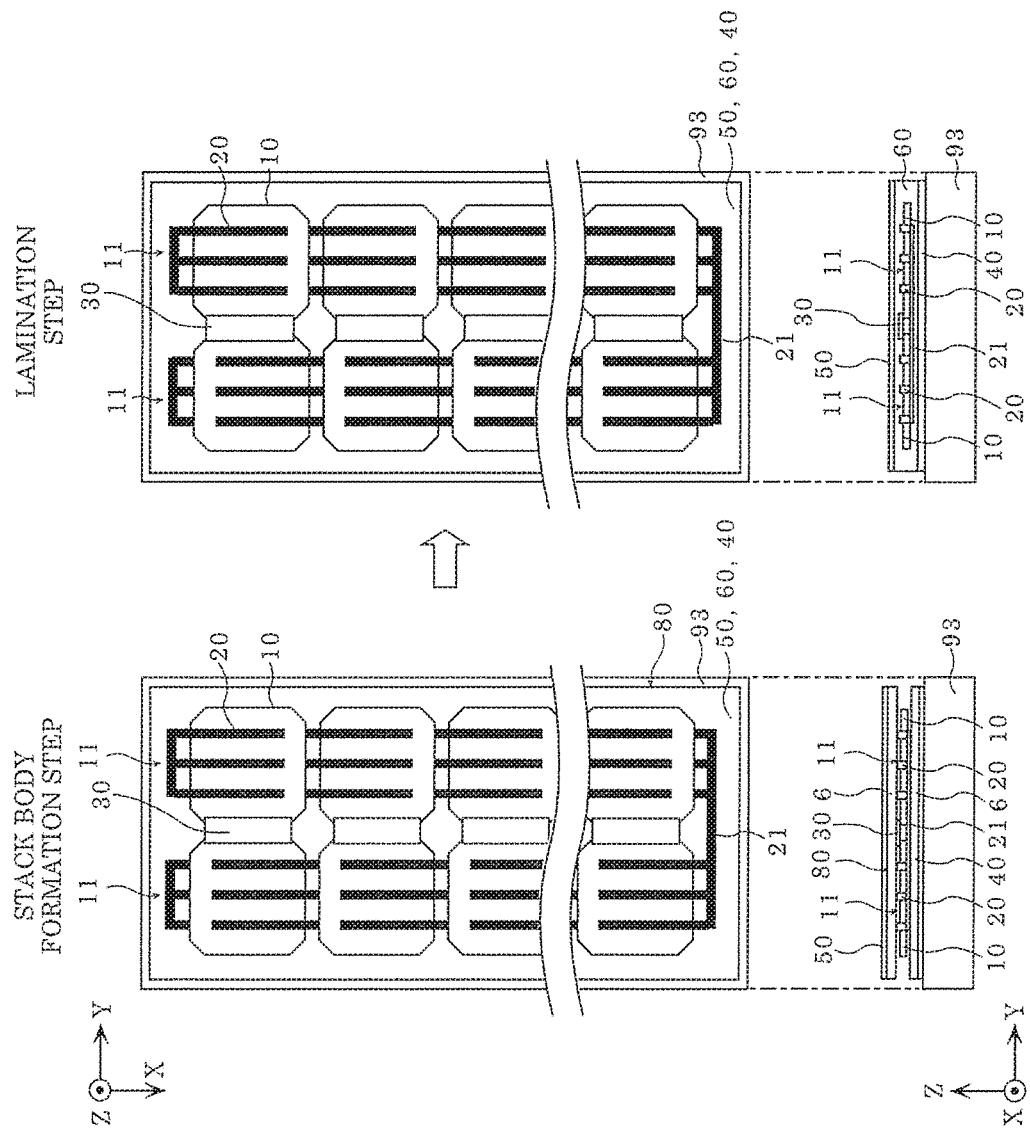
Figure 13:
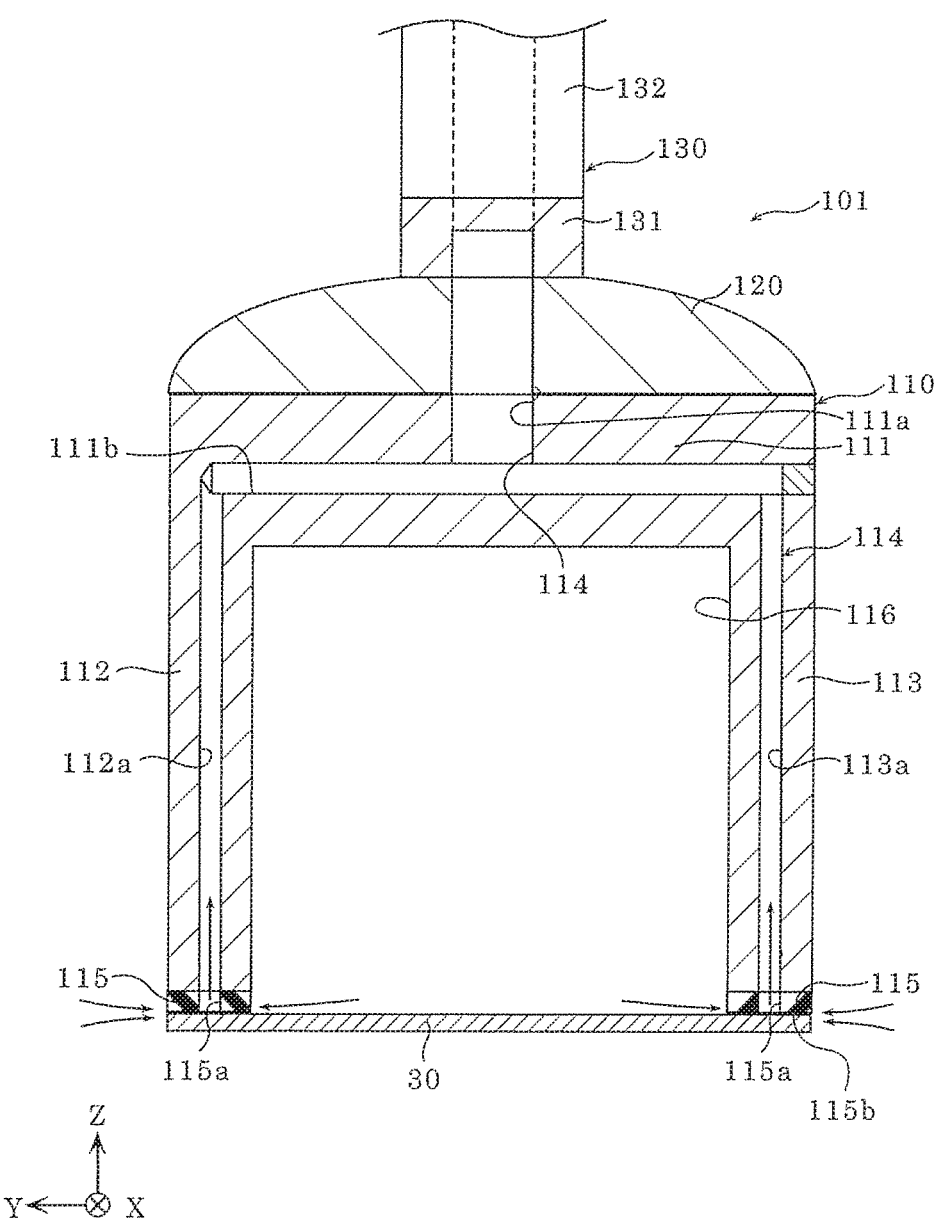
Figure 14:
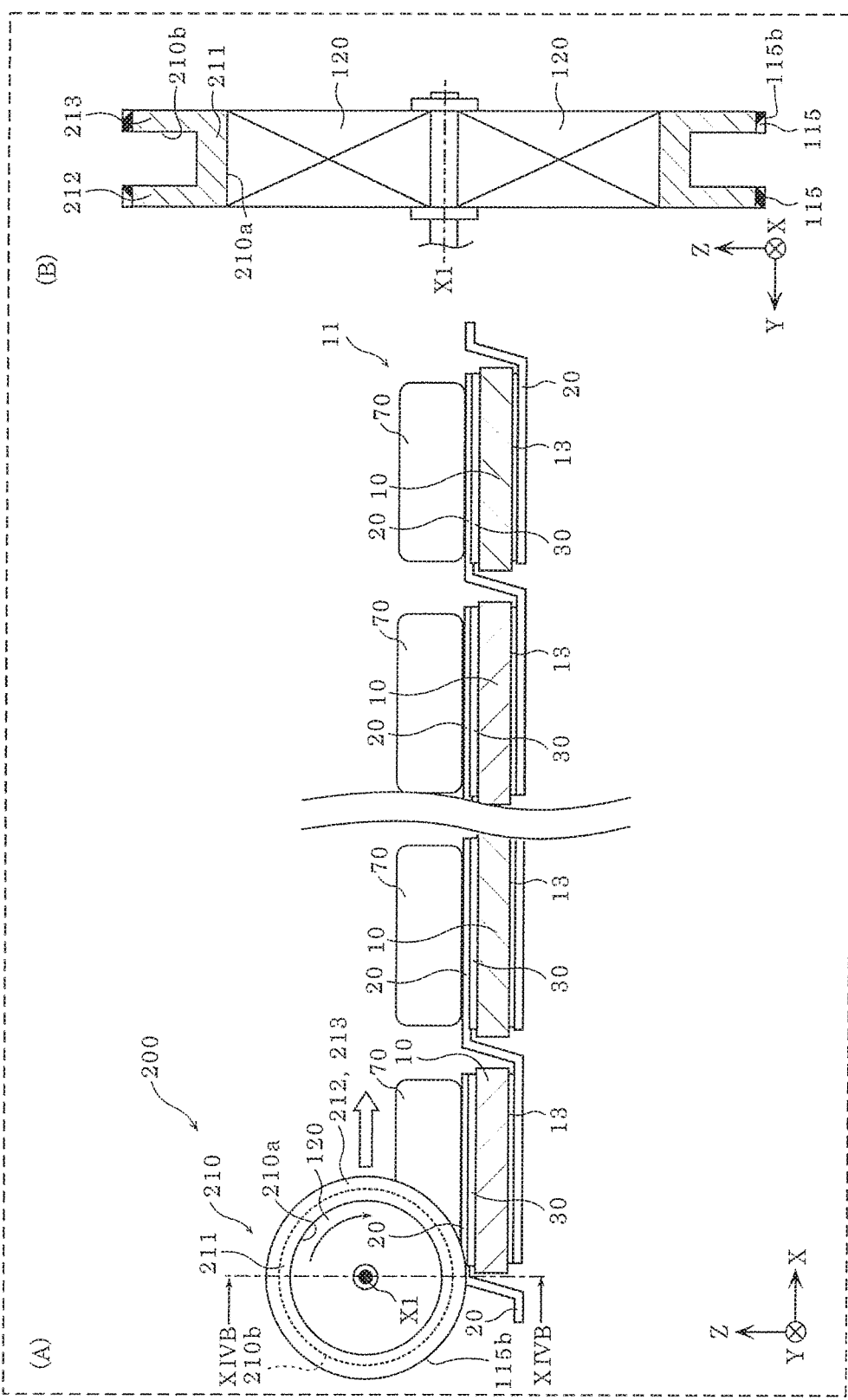
Figure 15:
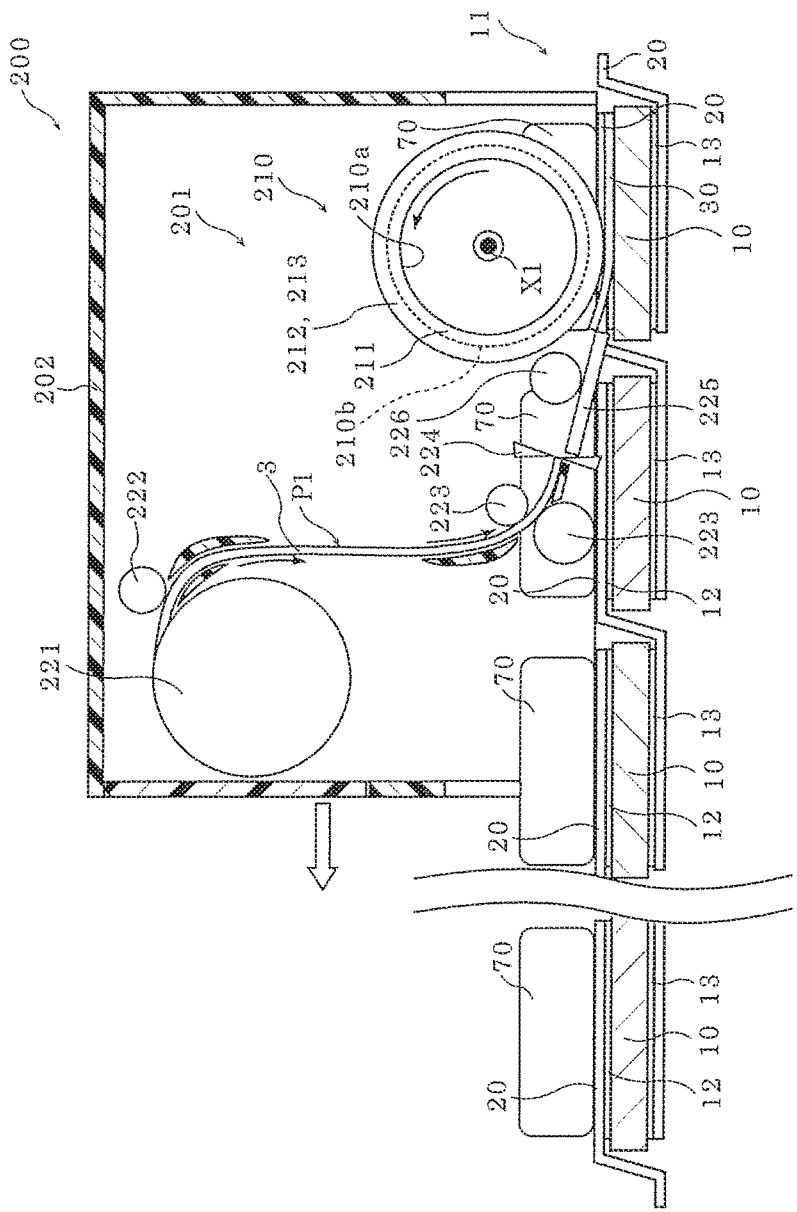
Figure 16:
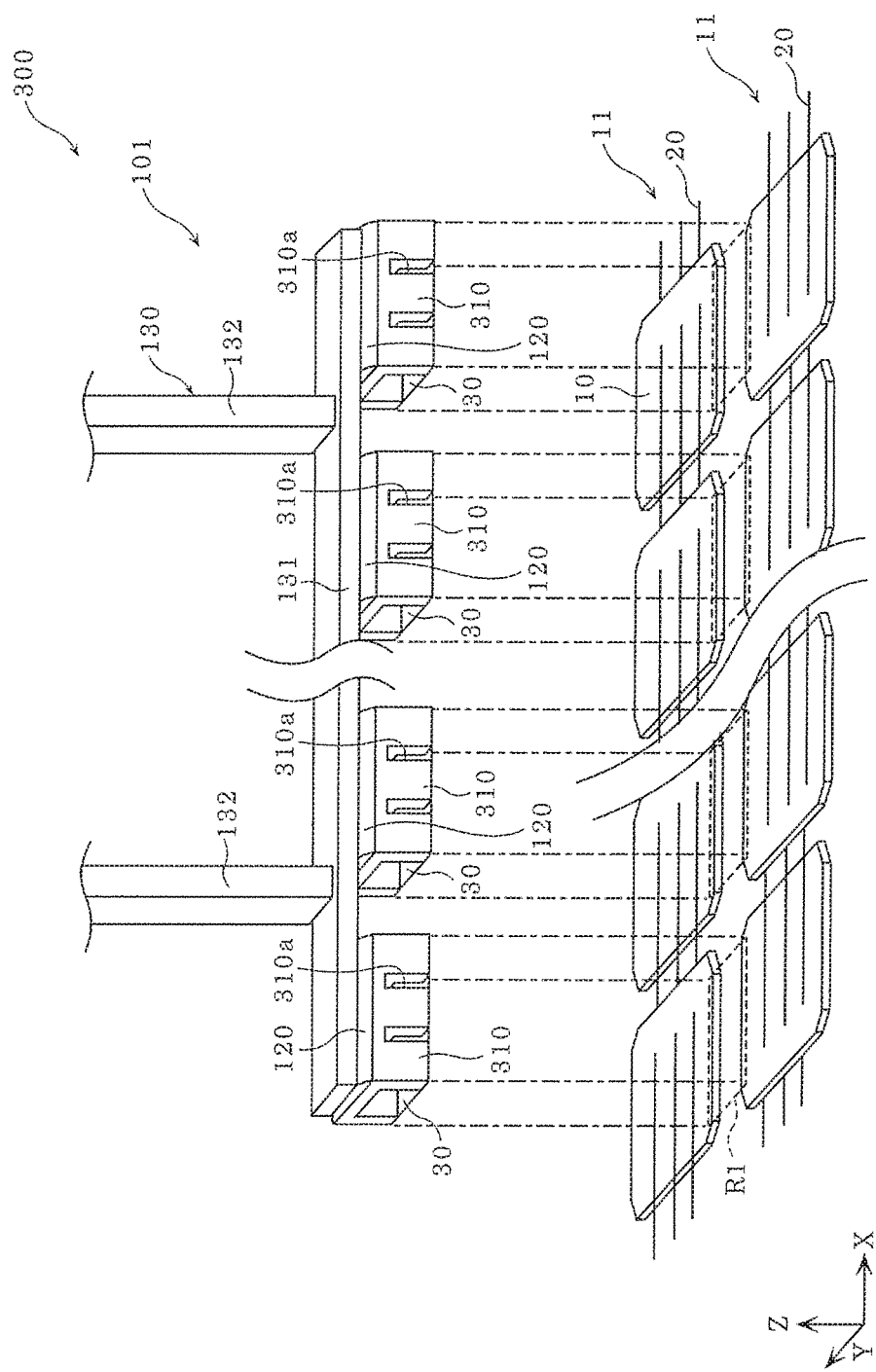
Figure 17:
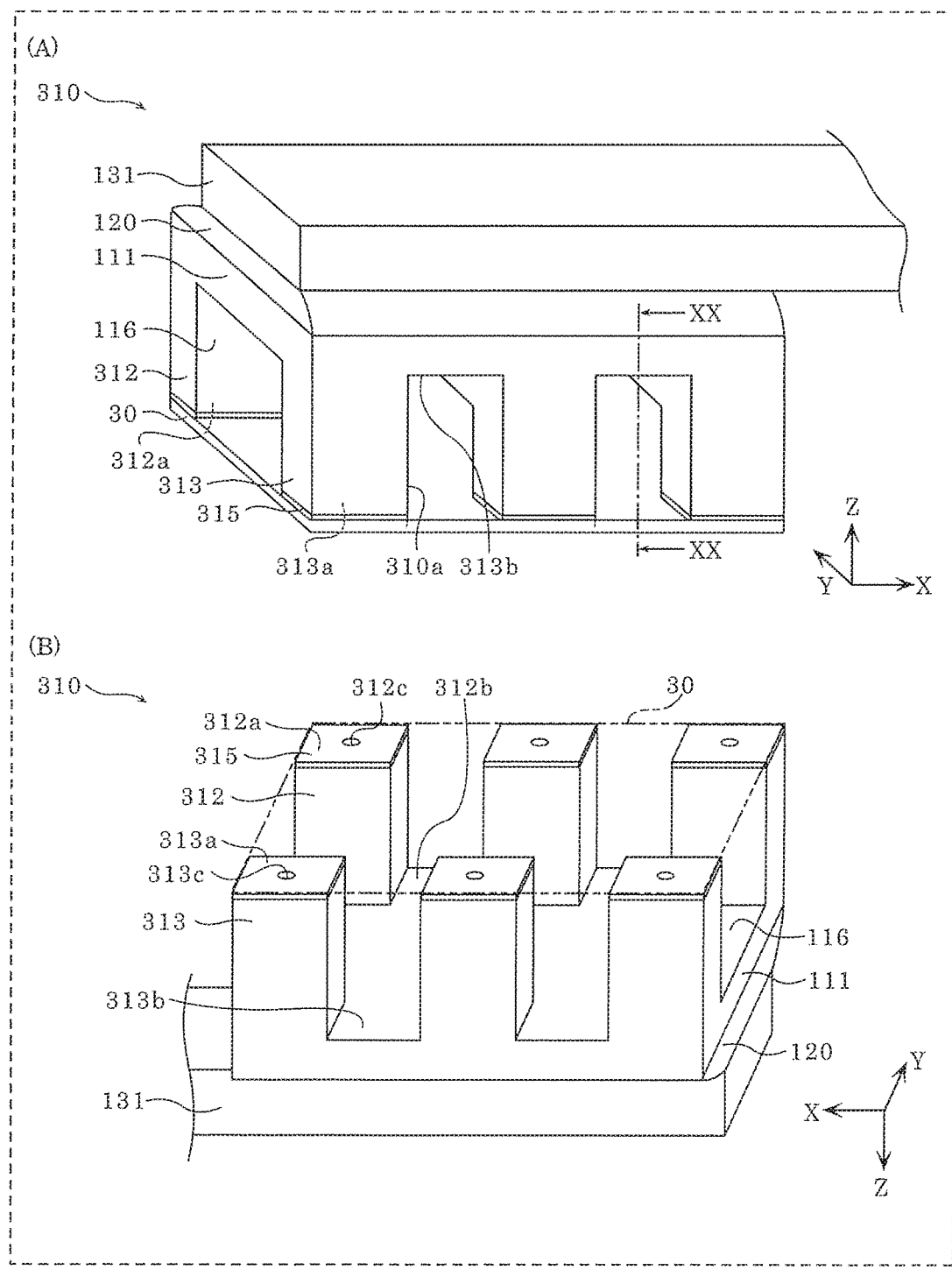
Figure 18:
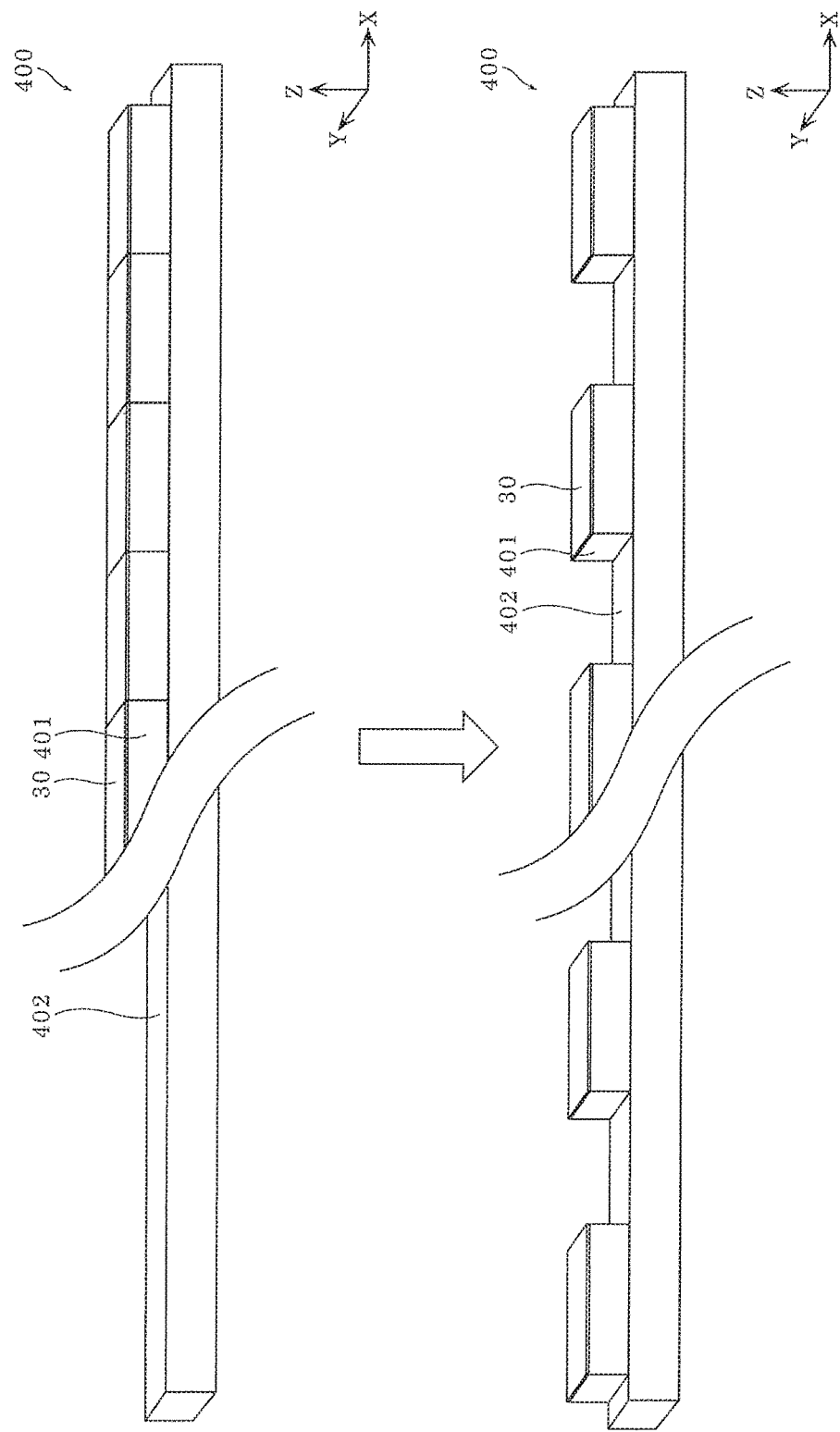
Figure 19:
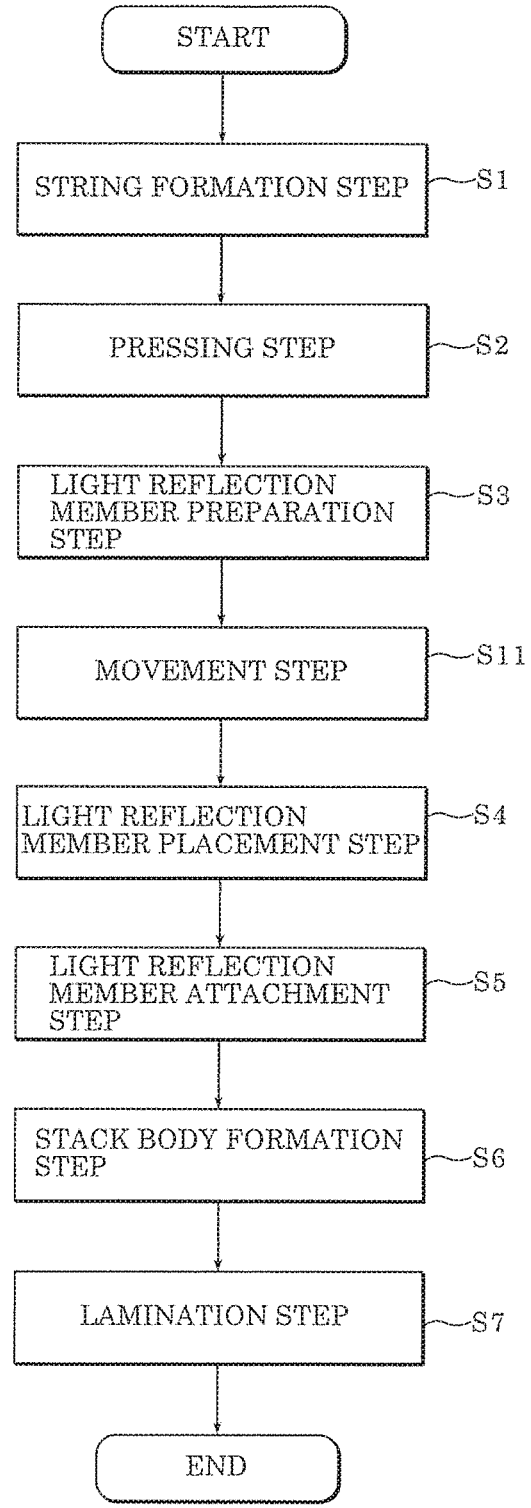
Figure 20:
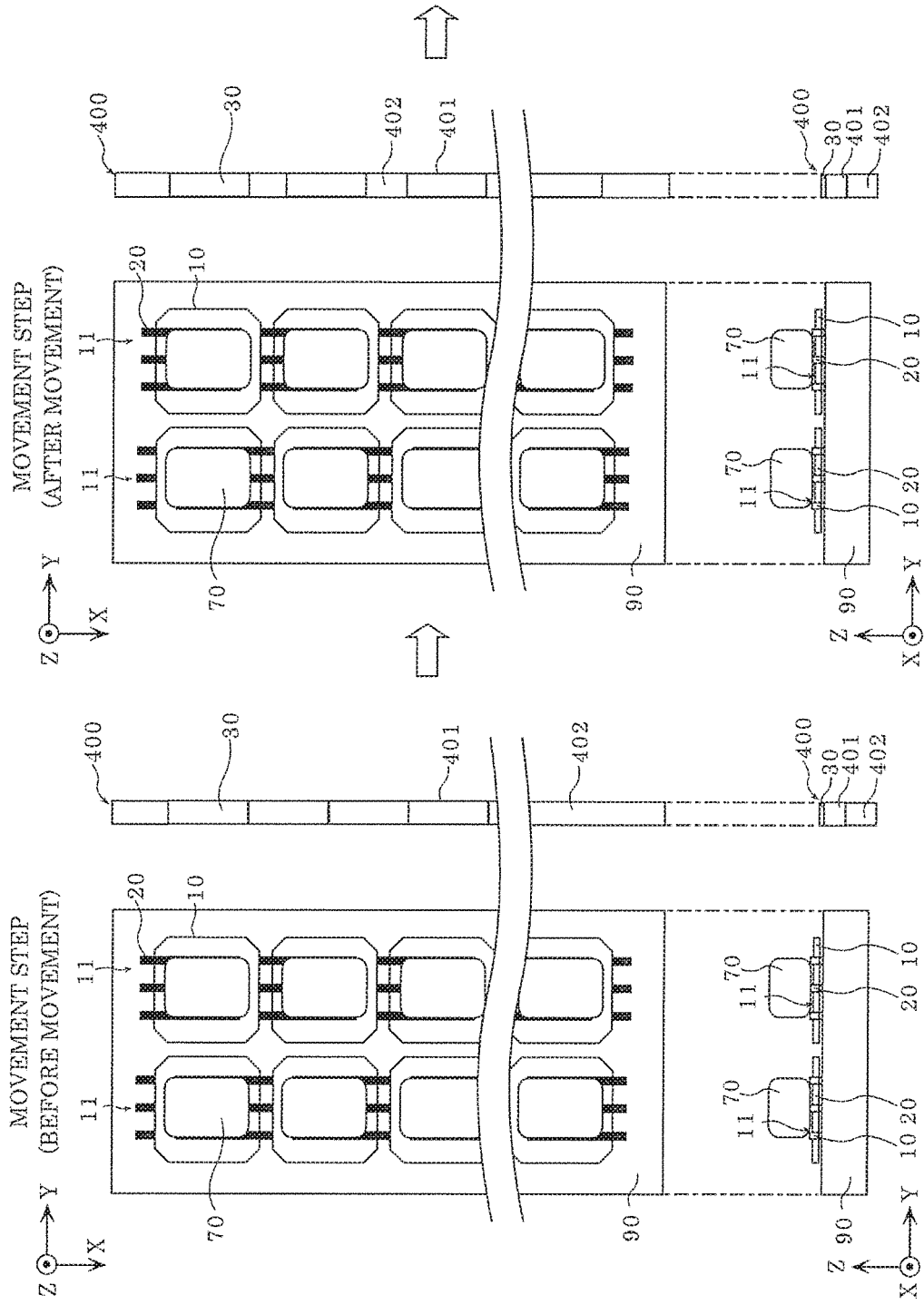
Figure 21:
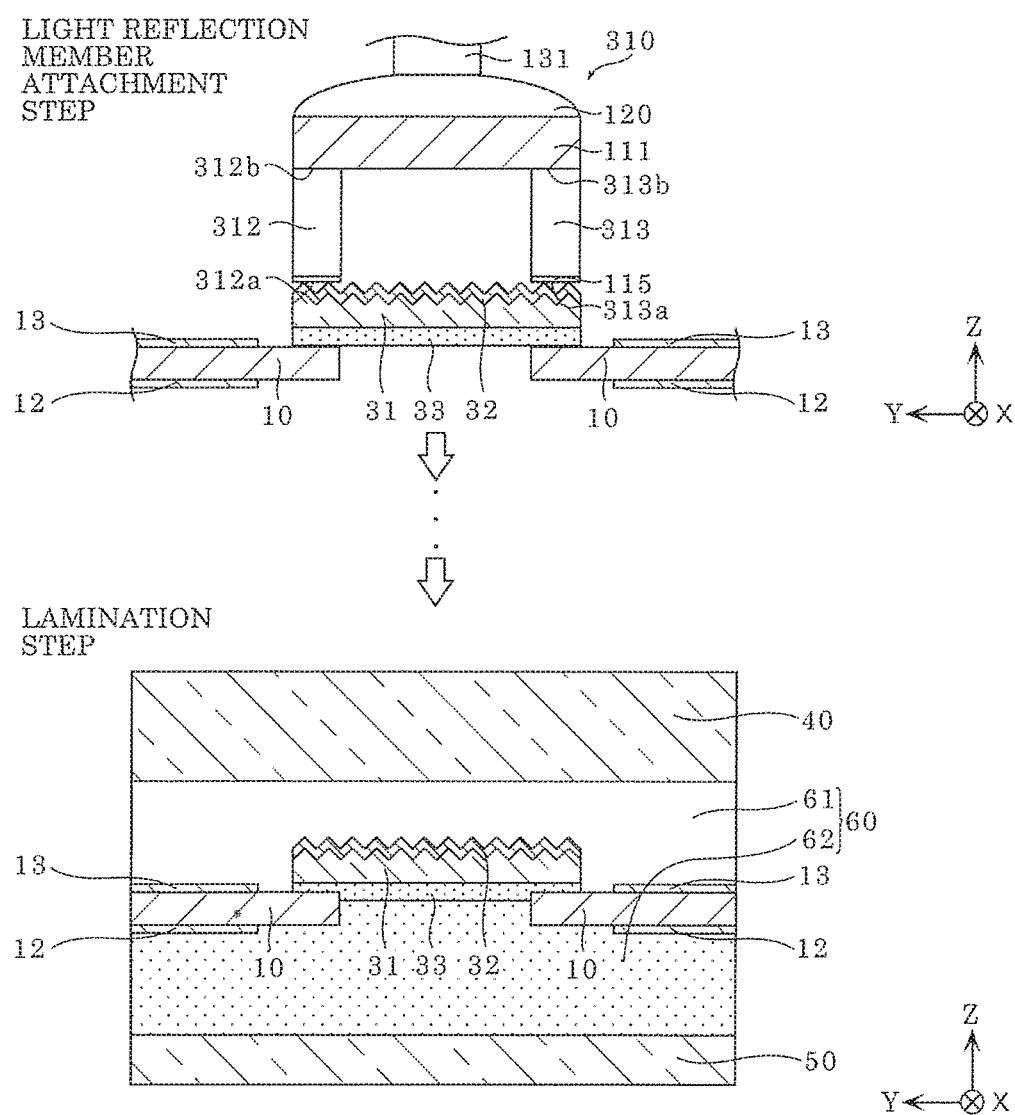

(A) in FIG. 10 is an explanatory diagram illustrating the state of the solar cell string of the solar cell module according to Embodiment 1 along line X-X in FIG. 9, and (B) in FIG. 10 is an explanatory diagram illustrating the pressing step in the method of manufacturing a solar cell module according to Embodiment 1 along line X-X in FIG. 9;

FIG. 11 is an explanatory diagram illustrating a light reflection member placement step and a light reflection member attachment step in the method of manufacturing a solar cell module according to Embodiment 1;

FIG. 12 is an explanatory diagram illustrating a stack body formation step and a lamination step in the method of manufacturing a solar cell module according to Embodiment 1;

FIG. 13 is a sectional view illustrating a compression bonding head of a compression bonding device according to a variation of Embodiment 1 along line VI-VI in FIG. 5;

(A) in FIG. 14 is an explanatory diagram illustrating the state of thermocompression-bonding a light reflection member to each solar cell using a compression bonding roller in a method of manufacturing a solar cell module according to Embodiment 2, and (B) in FIG. 14 is a sectional view illustrating the compression bonding roller of the compression bonding device according to Embodiment 2 along line XIVB-XIVB in (A) in FIG. 14;

FIG. 15 is an explanatory diagram illustrating the state of thermocompression-bonding a light reflection member to each solar cell using a compression bonding roller in a method of manufacturing a solar cell module according to a variation of Embodiment 2;

FIG. 16 is a perspective view of a compression bonding device and solar cell strings according to Embodiment 3;

(A) in FIG. 17 is an enlarged perspective view illustrating a compression bonding head of the compression bonding device according to Embodiment 3, and (B) in FIG. 17 is an enlarged perspective view illustrating the compression bonding head of the compression bonding device according to Embodiment 3;

FIG. 18 is a perspective view of a preparation table and light reflection members according to Embodiment 3;

FIG. 19 is a flowchart of a method of manufacturing a solar cell module according to Embodiment 3;

FIG. 20 is an explanatory diagram illustrating a movement step in the method of manufacturing a solar cell module according to Embodiment 3; and FIG. 21 is an explanatory diagram illustrating a light reflection member placement step and a lamination step in the method of manufacturing a solar cell module according to Embodiment 3.

DETAILED DESCRIPTION OF THE EMBODIMENTS

The following describes embodiments of the present disclosure with reference to drawings. The embodiments described below each show a specific example of the present disclosure. The numerical values, shapes, materials, structural elements, the arrangement and connection of the structural elements, etc. shown in the following embodiments are mere examples, and do not limit the scope of the present disclosure. Of the structural elements in the embodiments described below, the structural elements not recited in any one of the independent claims representing the broadest concepts of the present disclosure are described as optional structural elements.

Regarding the meaning of the term "approximately", for example, "approximately the same" covers not only "exactly the same" but also "substantially the same".

Each drawing is a schematic and does not necessarily provide precise depiction. The substantially same structural elements are given the same reference marks in the drawings, and repeated description is omitted or simplified.

Embodiment 1

The structure of solar cell module 1 according to Embodiment 1 is described below, with reference to FIGS. 1 to 4.

[Structure]

Figure 1:
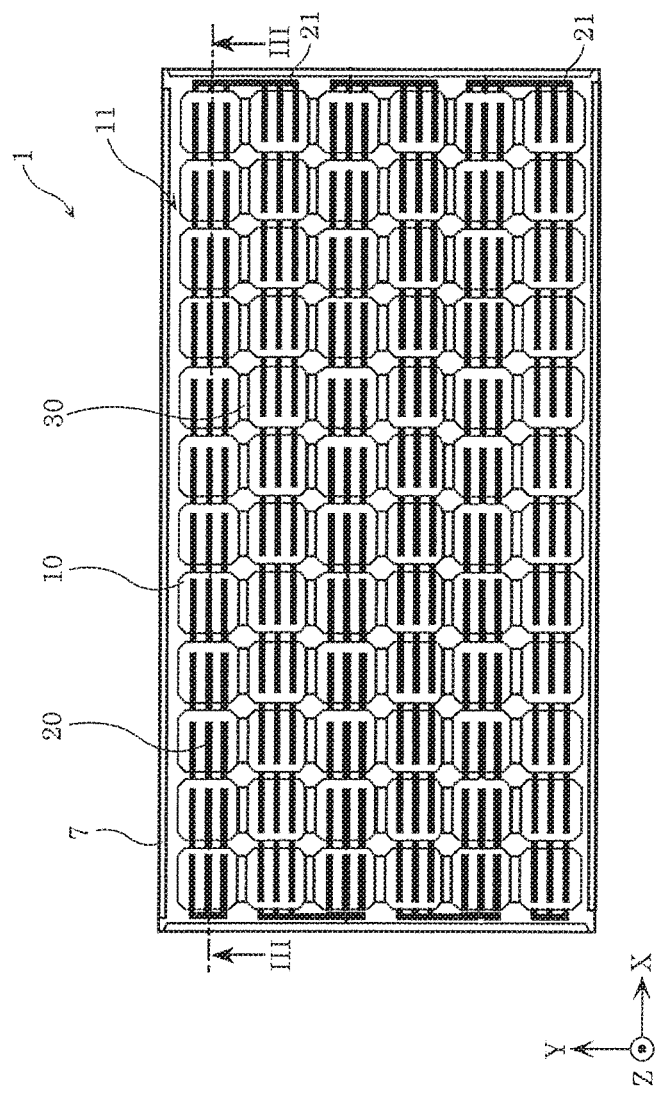
FIG. 1 is a plan view of a solar cell module according to Embodiment 1.
Figure 2:
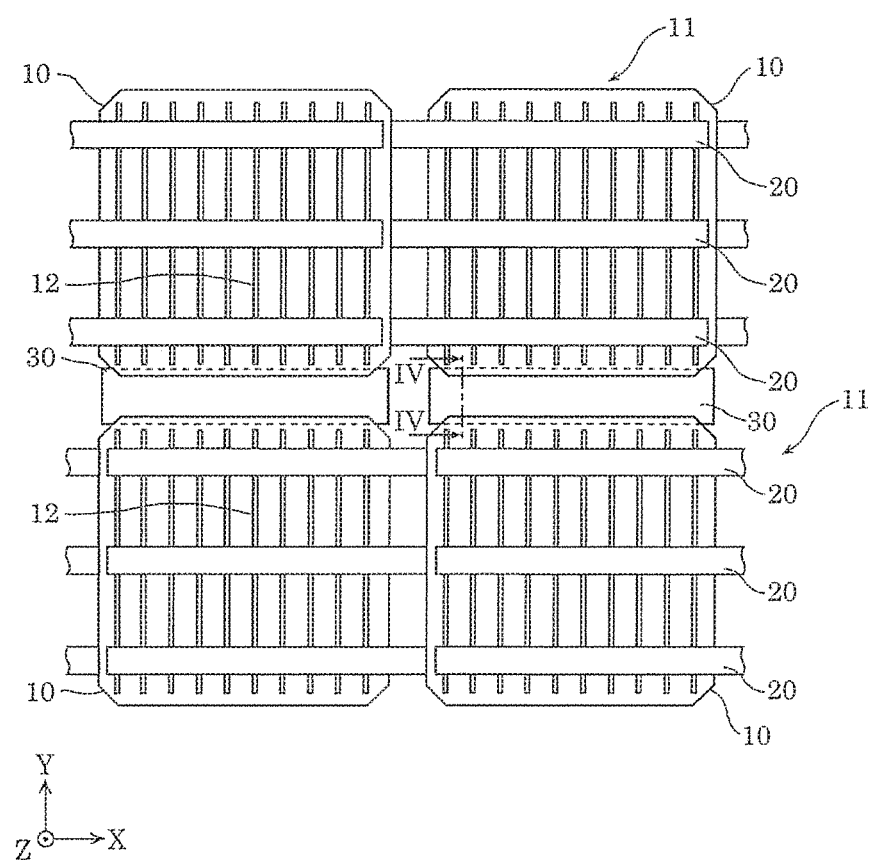
FIG. 2 is a partially enlarged plan view of the solar cell module according to Embodiment 1.
Figure 3:
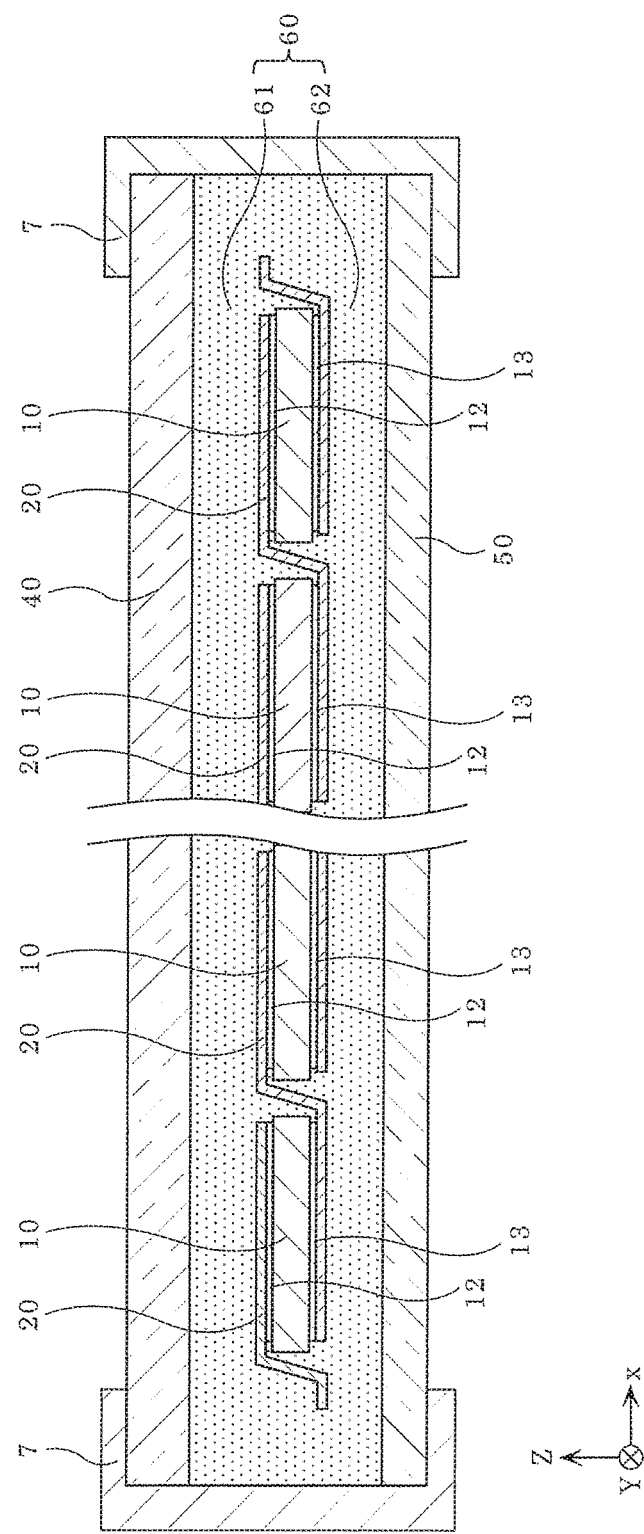
FIG. 3 is a sectional view of the solar cell module according to Embodiment 1 along line III-III in FIG. 1.
Figure 4:
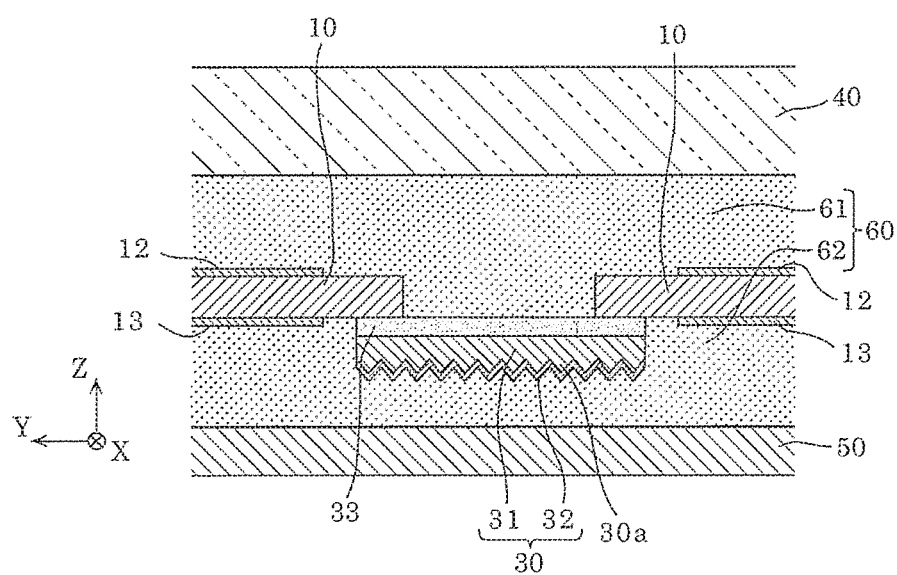
FIG. 4 is an enlarged sectional view of the solar cell module according to Embodiment 1 along line IV-IV in FIG. 2.

FIG. 1 is a plan view of solar cell module 1 according to Embodiment 1. FIG. 2 is a partially enlarged plan view of solar cell module 1 according to Embodiment 1. FIG. 3 is a sectional view of solar cell module 1 according to Embodiment 1 along line III-III in FIG. 1. FIG. 4 is an enlarged sectional view of solar cell module 1 according to Embodiment 1 along line IV-IV in FIG. 2.

In FIG. 1, the direction in which 12 solar cells 10 are arranged at regular intervals along the row direction is defined as the X-axis direction, the direction in which six solar cell strings 11 are arranged along the column direction so that adjacent two solar cell strings 11 are parallel to each other as the Y-axis direction, and the vertical (up-down) direction as the Z-axis direction. The X-axis direction, the Y-axis direction, and the Z-axis direction vary depending on the use mode, and so are not limited to those in FIG. 1. The same applies to the drawings other than FIG. 1.

The "front surface" of solar cell module 1 means the surface on which light on the "front surface" side of the solar cell can be incident, and the "back surface" of solar cell module 1 means the surface opposite to the front surface. The "front surface" of solar cell module 1 is on the upper side (positive Z-axis direction), and the "back surface" of solar cell module 1 is on the lower side (negative Z-axis direction).

Solar cell module 1 illustrated in FIG. 1 is, for example, one of a plurality of modules mounted on the roof of a facility such as a house. Solar cell module 1 has a structure in which plurality of solar cells 10 are sealed with filling member 60 between front surface protection member 40 (an example of a light-transmitting substrate) and back surface protection member 50 (an example of a light-transmitting substrate). Solar cell module 1 is, for example, shaped like an approximately rectangular plate in an XY planar view. As an example, solar cell module 1 is approximately a rectangle of about 1600 mm in length in the row direction and about 800 mm in length in the column direction. The shape of solar cell module 1 is not limited to the shape in which six solar cell strings 11 each having 12 solar cells 10 are arranged, and is not limited to a rectangle.

Solar cell module 1 includes plurality of solar cells 10, wiring material 20 (interconnector), light reflection member 30, front surface protection member 40, back surface protection member 50, filling member 60, and frame 7.

Solar cell 10 is a photoelectric conversion element (photovoltaic element) for converting light such as sunlight into electricity. Plurality of solar cells 10 are arranged in a matrix in the same plane to form a cell array.

Plurality of solar cells 10 linearly arranged along one of the row direction and column direction are made into solar cell string 11 (cell string) by connecting adjacent two solar cells 10 by wiring material 20. Plurality of solar cells 10 in one solar cell string 11 are connected in series by wiring material 20.

Each solar cell string 11 is a group of solar cells 10 which is formed by connecting, by wiring material 20, 12 solar cells 10 arranged at regular intervals along the row direction. In more detail, each solar cell string 11 is formed by sequentially connecting two solar cells 10 adjacent in the row direction by three wiring materials 20 to thus connect all solar cells 10 arranged in a line along the row direction.

Plurality of solar cell strings 11 are formed. Plurality of solar cell strings 11 (solar cell strings) are arranged along the other one of the row direction and column direction. In this embodiment, six solar cell strings 11 are formed. Six solar cell strings 11 are arranged at regular intervals along the column direction so as to be parallel to each other.

Adjacent two solar cell strings 11 are connected to connection wiring 21 via wiring material 20 at both ends in the row direction. Solar cell string 11 connected to connection wiring 21 has its other end (positive X-axis side) connected to adjacent solar cell string 11 via connection wiring 21. Connection wiring 21 is a wiring member connecting solar cell strings 11. Plurality of solar cell strings 11 are thus connected in series or in parallel to form a cell array. In this embodiment, adjacent six solar cell strings 11 are connected in series to form one serial connection body (in which 72 solar cells 10 are connected in series).

As illustrated in FIG. 2, two solar cells 10 adjacent in the row direction and the column direction are arranged with a gap between. Light reflection member 30 is placed across this gap, as described later.

Solar cell 10 is shaped like an approximately rectangular plate in an XY planar view. In detail, solar cell 10 has a shape of an approximately 125 mm square truncated at its corners, that is, a shape of an approximately octagon formed by alternately connecting linear long sides and linear or nonlinear short sides. One solar cell string 11 is formed so that the sides of adjacent two solar cells 10 face each other. The shape of solar cell 10 is not limited to an approximately rectangular shape.

Solar cell 10 has a semiconductor p-n junction as its basic structure. As an example, solar cell 10 includes: an n-type single-crystal silicon substrate which is an n-type semiconductor substrate; an n-type amorphous silicon layer and an n-side electrode formed in sequence on one main surface side of the n-type single-crystal silicon substrate; and a p-type amorphous silicon layer and a p-side electrode formed in sequence on the other main surface side of the n-type single-crystal silicon substrate. A passivation layer such as an i-type amorphous silicon layer, a silicon oxide layer, or a silicon nitride layer may be provided between the n-type single-crystal silicon substrate and the n-type amorphous silicon layer. A passivation layer may also be provided between the n-type single-crystal silicon substrate and the p-type amorphous silicon layer. The n-side electrode and the p-side electrode are, for example, transparent electrodes of indium tin oxide (ITO) or the like.

Although solar cell 10 has the n-side electrode on the main light receiving surface side (front surface protection member 40 side) of solar cell module 1 in this example, this is not a limitation. In the case where solar cell module 1 is one-surface light reception type, the electrode (p-side electrode in this embodiment) located on the back surface side need not be transparent, and may be, for example, a metal electrode having reflectivity.

As illustrated in FIG. 3, in each solar cell 10, the front surface is the surface on the front surface protection member 40 side (in the positive Z-axis direction), and the back surface is the surface on the back surface protection member 50 side (in the negative Z-axis direction). Front surface collector electrode 12 and back surface collector electrode 13 are formed in solar cell 10. Front surface collector electrode 12 is electrically connected to the front surface side electrode (e.g. n-side electrode) of solar cell 10. Back surface collector electrode 13 is electrically connected to the back surface side electrode (e.g. p-side electrode) of solar cell 10.

For example, each of front surface collector electrode 12 and back surface collector electrode 13 includes: a plurality of finger electrodes formed linearly to be orthogonal to the extending direction of wiring material 20; and a plurality of bus bar electrodes connected to the finger electrodes and formed linearly along the direction (the extending direction of wiring material 20) orthogonal to the finger electrodes. The number of bus bar electrodes is, for example, the same as the number of wiring materials 20. In this embodiment, the number of bus bar electrodes is three. Although front surface collector electrode 12 and back surface collector electrode 13 have the same shape in this example, this is not a limitation.

Front surface collector electrode 12 and back surface collector electrode 13 are made of a low-resistance conductive material such as silver (Ag). For example, front surface collector electrode 12 and back surface collector electrode 13 can each be formed by screen printing, in a predetermined pattern, a conductive paste (silver paste, etc.) obtained by dispersing a conductive filler such as silver in binder resin.

In solar cell 10, both of the front surface and back surface serve as a light receiving surface. When light enters solar cell 10, carriers are generated in the photoelectric conversion portion of solar cell 10. The generated carriers are collected by front surface collector electrode 12 and back surface collector electrode 13, and flow into wiring material 20. Providing front surface collector electrode 12 and back surface collector electrode 13 in solar cell 10 allows the carriers generated in solar cell 10 to be efficiently extracted to an external circuit.

As illustrated in FIG. 2, wiring material 20 electrically connects adjacent two solar cells 10 in solar cell string 11. In this embodiment, adjacent two solar cells 10 are connected by three wiring materials 20 arranged approximately parallel to each other. Each wiring material 20 extends along the direction in which adjacent two solar cells 10 to be connected are arranged.

Wiring material 20 is long conductive wiring, for example, ribbon-like metal foil or a thin metal wire. For example, wiring material 20 is made by cutting metal foil, such as copper foil or silver foil, the entire surface of which is coated with a solder material, silver, or the like, in strip form with a predetermined length.

Each wiring material 20 has one end located on the front surface of one of adjacent two solar cells 10, and the other end located on the back surface of the other one of adjacent two solar cells 10.

Each wiring material 20 electrically connects the n-side collector electrode (front surface side collector electrode) of one of adjacent two solar cells 10 and the p-side collector electrode (back surface side collector electrode) of the other one of adjacent two solar cells 10. In detail, wiring material 20 is bonded to the bus bar electrode of front surface collector electrode 12 of one solar cell 10 and the bus bar electrode of back surface collector electrode 13 of the other solar cell 10. Wiring material 20 and front surface collector electrode 12 (back surface collector electrode 13) are adhered to each other by, for example, thermocompression-bonding with a conductive adhesive in between.

Examples of the conductive adhesive include a conductive adhesion paste, a conductive adhesion film, and an anisotropic conductive film. The conductive adhesion paste is, for example, a paste-like adhesive obtained by dispersing conductive particles in a thermosetting adhesive resin material such as epoxy resin, acrylic resin, or urethane resin. The conductive adhesion film and the anisotropic conductive film are each a film-like material obtained by dispersing conductive particles in a thermosetting adhesive resin material.

Wiring material 20 and front surface collector electrode 12 (back surface collector electrode 13) may be bonded not by a conductive adhesive but by a solder material. Moreover, a resin adhesive not containing conductive particles may be used instead of the conductive adhesive. In this case, by appropriately designing the application thickness of the resin adhesive, the resin adhesive softens during pressure application in thermocompression-bonding, and the front surface of front surface collector electrode 12 and wiring material 20 are brought into direct contact with each other and electrically connected.

As illustrated in FIG. 4, solar cell 10 is provided with light reflection member 30. Light reflection member 30 is provided on each of plurality of solar cells 10.

Light reflection member 30 is located at the gap between adjacent two solar cells 10. In this embodiment, light reflection member 30 is provided on each of two solar cells 10 adjacent in the Y-axis direction, across the gap between adjacent two solar cells 10. The gap between adjacent two solar cells 10 is the gap between the facing sides of adjacent two solar cells 10. The gap between adjacent two solar cells 10 is long in the row direction, and extends in the direction parallel to solar cell string 11. Light reflection member 30 is thus provided across adjacent two solar cells 10 arranged with a gap in between, on the back surface side of adjacent two solar cells 10.

In this embodiment, two light reflection members 30 are provided on each solar cell 10, except solar cells 10 of outermost solar cell strings 11. Light reflection member 30 is a tape-like member extending in the row direction of solar cell string 11, and is shaped like a long rectangle as an example. Light reflection member 30 is attached along one side of solar cell 10 so that one end of light reflection member 30 in the width direction (Y-axis direction) overlaps one end of solar cell 10. In other words, light reflection member 30 is attached approximately parallel to wiring material 20.

Light reflection member 30 includes: resin base material 31; and reflection film 32 formed on the back surface of resin base material 31 (the negative Z-axis side surface of resin base material 31). Resin base material 31 is, for example, made of polyethylene terephthalate (PET) or acrylic. Reflection film 32 is, for example, a metal film made of metal such as aluminum or silver. In this embodiment, reflection film 32 is an aluminum evaporated film.

The back surface of resin base material 31 has concavo-convex (uneven) portion 30a, and reflection film 32 is formed on concavo-convex portion 30a (back surface) of resin base material 31 by evaporation. Resin base material 31 and reflection film 32 are thus stacked to form light reflection member 30 having a concavo-convex shape on its back surface. When light which has entered solar cell module 1 is incident on the front surface of light reflection member 30, concavo-convex portion 30a scatters the light so that the light is reflected off the interface between front surface protection member 40 and an air layer or the interface between front surface protection member 40 and filling member 60, thus guiding the light to solar cell 10. In this way, light entering the region of the gap between adjacent two solar cells 10 also effectively contributes to power generation, with it being possible to improve the power generation efficiency of solar cell module 1.

Light reflection member 30 is shaped like a long rectangle. For example, light reflection member 30 is 100 mm to 130 mm in length, 1 mm to 20 mm in width, and 0.05 mm to 0.5 mm in thickness. In this embodiment, light reflection member 30 is 125 mm in length, 5 mm in width, and 0.1 mm in thickness.

The thickness of resin base material 31 is, for example, 50 µm to 500 µm. Regarding concavo-convex portion 30a, for example, the height between the concave portion and the convex portion is 20 µm or more and 100 µm or less, and the interval (pitch) between adjacent convex portions is 20 µm or more and 400 µm or less. In this embodiment, the height between the concave portion and the convex portion is 12 µm, and the interval (pitch) between adjacent convex portions is 40 µm.

Although the shape of concavo-convex portion 30a is a triangular groove along the longitudinal direction of light reflection member 30 in this example, this is not a limitation. The shape may be any shape that can scatter light, such as a triangular groove along a direction intersecting the longitudinal direction of light reflection member 30, a cone, a quadrangular pyramid, a polygonal pyramid, or a combination thereof.

Light reflection member 30 is provided on solar cell 10, by attaching the front surface of resin base material 31 (the positive Z-axis side surface of resin base material 31) and the negative Z-axis side surface of solar cell 10 to each other with resin adhesive 33. For example, light reflection member 30 and solar cell 10 are adhered to each other by thermo-compression-bonding with resin adhesive 33 in between. Resin adhesive 33 is, for example, a heat-sensitive adhesive or a pressure-sensitive adhesive made of EVA, and may be provided on the front surface of resin base material 31 beforehand. In other words, light reflection member 30 may include resin base material 31, reflection film 32, and resin adhesive 33. Light reflection member 30 is thus adhered and fixed to solar cell 10 by thermocompression-bonding. In this embodiment, light reflection member 30 is attached to the back surface side of solar cell module 1.

Front surface protection member 40 is a member for protecting the front surface of solar cell module 1, and protects the inside of solar cell module 1 (such as solar cell 10) from the external environment such as the wind and rain and external impact. Front surface protection member 40 is located on the front surface side of solar cell 10, and protects the light receiving surface on the front surface side of solar cell 10.

Front surface protection member 40 is provided on the front surface side of solar cell 10, and so is composed of a light-transmitting member that transmits light in a wavelength band used for photoelectric conversion in solar cell 10. Front surface protection member 40 is, for example, a glass substrate (transparent glass substrate) made of a transparent glass material, or a resin substrate made of a film-like or plate-like hard resin material having light-transmitting and water-shielding properties.

Back surface protection member 50 is a member for protecting the back surface of solar cell module 1, and protects the inside of solar cell module 1 from the external environment. Back surface protection member 50 is located on the back surface side of solar cell 10.

In this embodiment, the back surface of solar cell 10 is also a light receiving surface. Hence, back surface protection member 50 protects the light receiving surface on the back side of solar cell 10, and is composed of a light-transmitting member. Back surface protection member 50 is, for example, a film-like or plate-like resin sheet made of a resin material such as polyethylene terephthalate (PET) or polyethylene naphthalate (PEN). Back surface protection member 50 may be a glass sheet or glass substrate made of a glass material.

In the case where light does not enter from the back surface side of solar cell 10, back surface protection member 50 may be a non-light-transmitting plate or film. In this case, for example, back surface protection member 50 may be a non-light-transmitting member (light-shielding member) such as a black color member or a stack film, e.g. a resin film, having metal foil such as aluminum foil inside.

The space between front surface protection member 40 and back surface protection member 50 is filled with filling member 60. Solar cell 10 and each of front surface protection member 40 and back surface protection member 50 are adhered and fixed to each other by filling member 60.

Filling member 60 (filler) is located between front surface protection member 40 and back surface protection member 50. In this embodiment, filling member 60 fills the space between front surface protection member 40 and back surface protection member 50.

Filling member 60 is made of a light-transmitting resin material such as ethylene vinyl acetate (EVA). Filling member 60 is formed by sandwiching plurality of solar cells 10 between front surface side filling member 61 and back surface side filling member 62. For example, filling member 60 is formed by performing lamination treatment (lamination) on two resin sheets (EVA sheets) sandwiching six solar cell strings 11.

Frame 7 is an outer frame covering the peripheral edges of solar cell module 1. Frame 7 in this embodiment is an aluminum frame made of aluminum. Four frames 7 are attached to the respective four sides of solar cell module 1. For example, frame 7 is bonded to each side of solar cell module 1 by an adhesive.

Solar cell module 1 is provided with a terminal box (not illustrated) for extracting power generated in solar cells 10.

For example, the terminal box is fixed to back surface protection member 50. The terminal box contains a plurality of circuit components such as diodes for preventing hot spots.

[Manufacturing Method: 1-1. Structure of Compression Bonding Device]

Compression bonding device 100 is used in the manufacture of solar cell module 1. The structure of compression bonding device 100 is described first, with reference to FIGS. 5 to 7.

Figure 6:
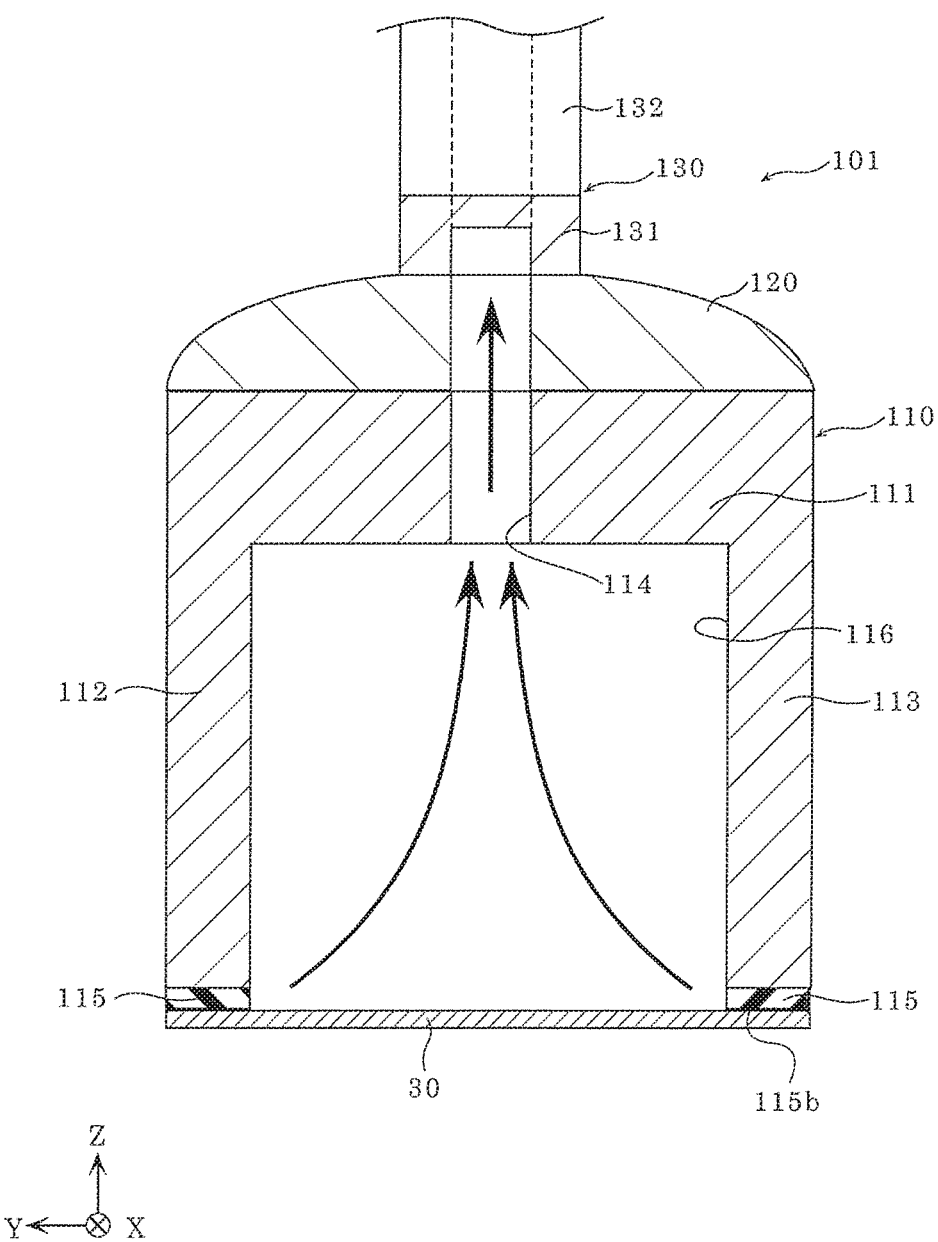
FIG. 6 is a sectional view illustrating a compression bonding head of the compression bonding device according to Embodiment 1 along line VI-VI in FIG. 5.
Figure 7:
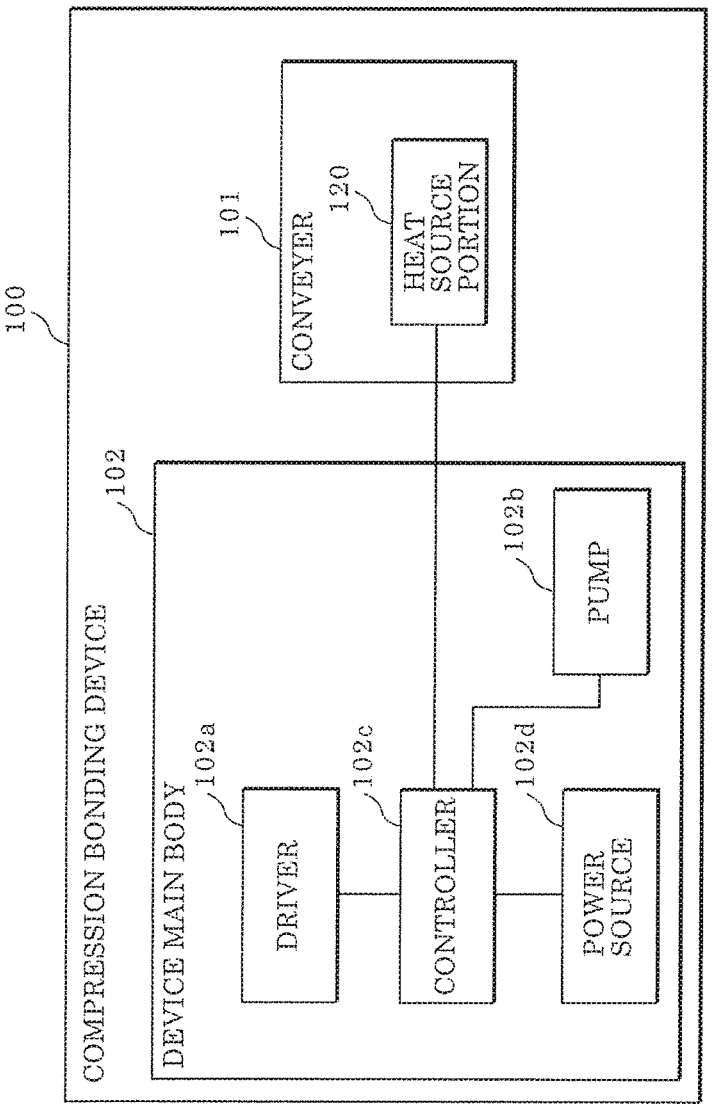
FIG. 7 is a block diagram illustrating the compression bonding device in a method of manufacturing a solar cell module according to Embodiment 1.

FIG. 5 is a perspective view of compression bonding device 100 and solar cell strings 11 according to Embodiment 1. FIG. 6 is a sectional view illustrating compression bonding head 110 of compression bonding device 100 according to Embodiment 1 along line VI-VI in FIG. 5. FIG. 7 is a block diagram illustrating compression bonding device 100 in the method of manufacturing solar cell module 1 according to Embodiment 1. FIG. 5 illustrates the state where compression bonding head 110 is moving while holding light reflection member 30 in a light reflection member placement step (S4). Work table 90, preparation table 91, pressing jig 70, etc. are omitted in FIG. 5.

As illustrated in FIG. 5, in the manufacture of solar cell module 1, compression bonding device 100 is used when placing light reflection member 30 on each of adjacent two solar cells 10 and thermocompression-bonding them. Compression bonding device 100 includes conveyor 101 and device main body 102.

Conveyor 101 includes plurality of compression bonding heads 110, plurality of heat source portions 120, and arm portion 130.

Arm portion 130 is controlled by device main body 102 in FIG. 7, and freely moves according to device main body 102. In this embodiment, arm portion 130 includes: first support portion 131 extending in the row direction parallel to solar cell string 11; and second support portion 132 orthogonal to first support portion 131 at the center part of first support portion 131.

First support portion 131 is provided with plurality of compression bonding heads 110 on the solar cell string 11 side. In this embodiment, first support portion 131 is provided with 12 compression bonding heads 110.

Compression bonding head 110 is a long housing extending in the row direction (longitudinal direction). Compression bonding head 110 is fixed to first support portion 131 via heat source portion 120. Compression bonding heads 110 are arranged in a line at approximately regular intervals in the row direction. In detail, compression bonding heads 110 are arranged in a line at approximately regular intervals along first support portion 131 so as to correspond to placement regions R1 arranged in the row direction each for adjacent two solar cells 10 in solar cell strings 11, in an XY planar view. Placement region R1 is a region made up of the region where light reflection member 30 overlaps the gap between adjacent two solar cells 10 and the region (overlap region) where part of light reflection member 30 overlaps the end of each solar cell 10, in an XY planar view. Compression bonding heads 110 are arranged in a line at approximately regular intervals along first support portion 131 so that, when compression bonding heads 110 are lowered toward solar cells 10, compression bonding heads 110 approximately match placement regions R1. In other words, light reflection member 30 and placement region R1 have approximately the same shape and size in an XY planar view. Although compression bonding heads 110 are arranged in a line in the row direction in this embodiment, in the case where there are three or more solar cell strings, compression bonding heads 110 may be arranged in two or more lines so as to correspond to all placement regions R1.

As illustrated in FIG. 6, compression bonding head 110 is held horizontally by first support portion 131, and includes non-thermocompression bonding portion 111, first thermocompression bonding portion 112, and second thermocompression bonding portion 113.

Non-thermocompression bonding portion 111 is shaped like a long plate extending in the row direction. Non-thermocompression bonding portion 111 is a region not for thermocompression-bonding by compression bonding head 110 when placing light reflection member 30 in placement region R1 in FIG. 5. Non-thermocompression bonding portion 111 corresponds to the gap between adjacent two solar cells 10. Although groove portion 116 is hollow in this embodiment, groove portion 116 may be filled with such a material with low heat conductivity that keeps light reflection member 30 from being adhered to solar cell 10. In this case, the part filled with the material with low heat conductivity is also the non-thermocompression bonding portion.

First thermocompression bonding portion 112 and second thermocompression bonding portion 113 are shaped like long plates extending in the row direction at both ends of non-thermocompression bonding portion 111 in the column direction, and extend downward from non-thermocompression bonding portion 111. In detail, first thermocompression bonding portion 112 extends downward from the positive Y-axis side of non-thermocompression bonding portion 111, and second thermocompression bonding portion 113 extends downward from the negative Y-axis side of non-thermocompression bonding portion 111. First thermocompression bonding portion 112 and second thermocompression bonding portion 113 are approximately parallel to each other. Thus, in compression bonding head 110, non-thermocompression bonding portion 111 forms the bottom of groove portion 116 which is an upward depression from the lower end surface (negative Z-axis side surface) of compression bonding head 110. Groove portion 116 passes through compression bonding head 110 in the row direction. In other words, compression bonding head 110 is U-shaped as viewed in the row direction. Compression bonding head 110 is made of metal such as copper, iron, or aluminum, an alloy containing such metal, or the like.

The lower end surface of each of first thermocompression bonding portion 112 and second thermocompression bonding portion 113 is a region for adhering light reflection member 30 to solar cell 10. In detail, each of heated first thermocompression bonding portion 112 and second thermocompression bonding portion 113 thermocompression-bonds (adheres) light reflection member 30 to solar cell 10 via elastic portion 115. Thus, the part of light reflection member 30 overlapping the end of solar cell 10 in an XY planar view and the end of solar cell 10 are thermocompression-bonded and adhered with resin adhesive 33. The thickness of each of first thermocompression bonding portion 112 and second thermocompression bonding portion 113 in the column direction is approximately the same as the thickness of the overlap region of light reflection member 30 and solar cell 10 in the width direction.

First thermocompression bonding portion 112 and second thermocompression bonding portion 113 each have elastic portion 115 for thermocompression-bonding light reflection member 30. Elastic portion 115 is an elastic body such as silicon rubber. Elastic portion 115 is provided along the lower end surface of each of first thermocompression bonding portion 112 and second thermocompression bonding portion 113. Elastic portion 115 transfers the heat of each of heated first thermocompression bonding portion 112 and second thermocompression bonding portion 113, to enable the thermocompression-bonding of light reflection member 30 to solar cell 10. In other words, the lower end surface of elastic portion 115 is contact surface 115b that comes into contact with reflection film 32 of light reflection member 30.

Compression bonding head 110 has plurality of suction holes 114. Suction holes 114 are formed in a line at approximately regular intervals in non-thermocompression bonding portion 111 of groove portion 116. Compression bonding head 110 adsorbs light reflection member 30, by sucking external air from suction holes 114. Adsorbed light reflection member 30 is held horizontally. Although the external air sucked from suction holes 114 travels to device main body 102 in compression bonding device 100 in this embodiment, the external air may be discharged from discharge holes formed in first support portion 131, second support portion 132, or the like. In this case, below-mentioned pump 102b in FIG. 7 is provided in first support portion 131, second support portion 132, or the like.

Heat source portion 120 is a heater that is provided on the upper surface of compression bonding head 110 and heats compression bonding head 110 at a constant temperature. Heat source portion 120 heats compression bonding head 110 to a predetermined temperature, in order to thermocompression-bond light reflection member 30 to solar cell 10. Heat source portion 120 heats compression bonding head 110 to such a temperature at which light reflection member 30 can be thermocompression-bonded to solar cell 10. The temperature to which heat source portion 120 heats compression bonding head 110 is preferably about 70° C. to 80° C. In this embodiment, 12 compression bonding heads 110 are each provided with heat source portion 120.

Although only one first support portion 131 is provided in the row direction in this embodiment, in the case where there are three or more solar cell strings as in this embodiment, two or more first support portions 131 may be provided so as to correspond to all placement regions R1.

As illustrated in FIG. 7, device main body 102 includes: driver 102a that moves arm portion 130 to a predetermined position; pump 102b that adsorbs external air; and controller 102c that controls driver 102a, pump 102b, heat source portion 120, etc.

Driver 102a operates when supplied with power from power source 102d by controller 102c. For example, driver 102a starts operation upon receiving an operation start signal from controller 102c, and stops operation upon receiving an operation stop signal from controller 102c.

Controller 102c includes a control circuit for controlling a display (not illustrated), a storage (not illustrated), etc. Controller 102c is composed of a processor, a microcomputer, or the like.

As illustrated in FIGS. 5 and 7, controller 102c drives driver 102a, drives pump 102b, and controls the heating temperature of heat source portion 120 and the like, based on an operation program stored beforehand. Controller 102c controls driver 102a, to cause arm portion 130 to perform a predetermined operation. In detail, driver 102a moves compression bonding head 110 of arm portion 130, etc., from the position where light reflection member 30 is adsorbed to compression bonding head 110 to placement region R1. Controller 102c controls the suction amount of pump 102b, to cause light reflection member 30 to be adsorbed to compression bonding head 110. Controller 102c can perform control based on the operation program, according to signals of sensors such as a position sensor.

[Manufacturing Method: 1-2. Method of Manufacturing Solar Cell Module]

The method of manufacturing solar cell module 1 is described next, with reference to FIGS. 8 to 12.

Figure 8:
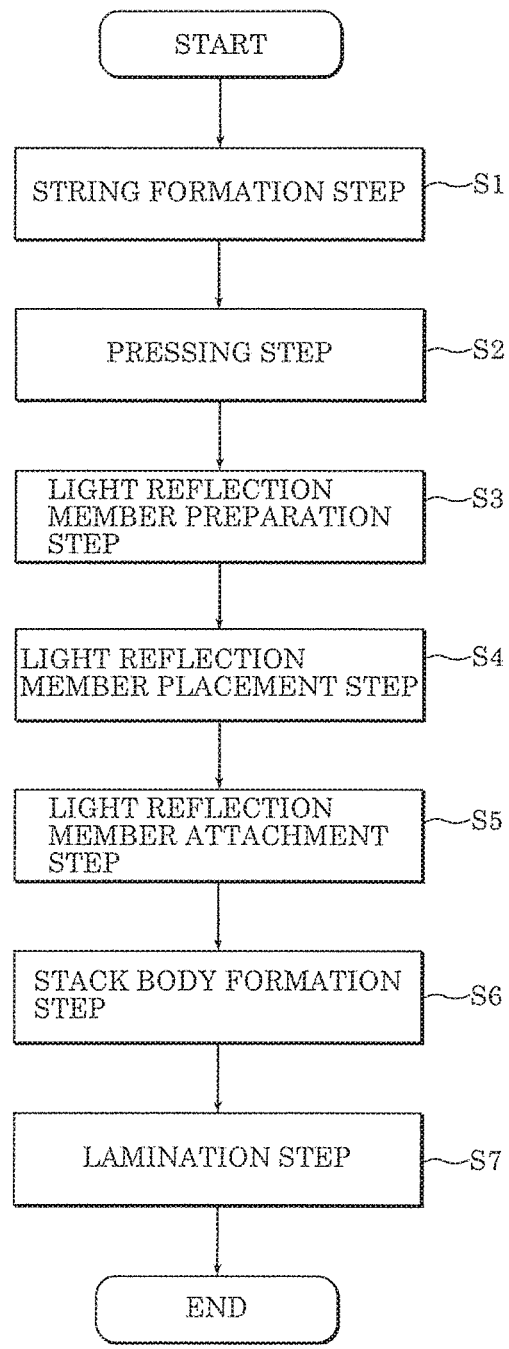
FIG. 8 is a flowchart illustrating the method of manufacturing a solar cell module according to Embodiment 1.

FIG. 8 is a flowchart illustrating the method of manufacturing solar cell module 1 according to Embodiment 1. FIG. 9 is an explanatory diagram illustrating a pressing step (S2) in the method of manufacturing solar cell module 1 according to Embodiment 1. (A) in FIG. 10 is an explanatory diagram illustrating the state of solar cell string 11 of solar cell module 1 according to Embodiment 1 along line X-X in FIG. 9. (B) in FIG. 10 is an explanatory diagram illustrating the pressing step (S2) in the method of manufacturing solar cell module 1 according to Embodiment 1 along line X-X in FIG. 9. FIG. 11 is an explanatory diagram illustrating a light reflection member placement step (S4) and a light reflection member attachment step (S5) in the method of manufacturing solar cell module 1 according to Embodiment 1. FIG. 12 is an explanatory diagram illustrating a stack body formation step (S6) and a lamination step (S7) in the method of manufacturing solar cell module 1 according to Embodiment 1.

(A) in FIG. 10 illustrates solar cell string 11 obtained as a result of a string formation step (S1) before the pressing step (S2). (B) in FIG. 10 illustrates the state of performing the pressing step (S2).

In the string formation step (S1) before the pressing step (S2), solar cell string 11 in which plurality of solar cells 10 are connected by wiring material 20 is prepared. In the string formation step (S1), plurality of solar cells 10 in each of which front surface collector electrode 12 and back surface collector electrode 13 in FIG. 3 have been formed are connected by wiring material 20.

In the string formation step (S1), wiring material 20 is attached to each solar cell 10 by thermocompression-bonding using the conductive adhesive. Thus, in this embodiment, the predetermined temperature is the heating temperature when thermocompression-bonding solar cell 10 to wiring material 20. For example, the predetermined temperature is set to 200° C., and thermocompression-bonding (heating and pressure application) is performed for 10 seconds to attach wiring material 20 and solar cell 10 to each other.

In this embodiment, a conductive adhesion paste is used as the conductive adhesive. In this case, the conductive adhesion paste is applied to the front surface of the bus bar electrode of front surface collector electrode 12 (back surface collector electrode 13) in solar cell 10 in FIG. 3, and wiring material 20 is placed on the bus bar electrode. Wiring material 20 and solar cell 10 are then thermocompression-bonded by compression bonding device 100, to electrically connect wiring material 20 and solar cell 10.

Plurality of solar cells 10 are sequentially connected by wiring material 20, to form solar cell string 11 in which plurality of solar cells 10 are connected in a line. In this embodiment, 12 solar cells 10 are connected together.

As illustrated in FIG. 8 and (A) in FIG. 10, solar cell string 11 formed in the string formation step (S1) may be warped. Besides, solar cell 10 in solar cell string 11 may itself be bent and warped due to stress between solar cell 10 and wiring material 20 connected to solar cell 10. Hence, before placing light reflection member 30 on solar cell 10, each solar cell 10 is pressed by pressing jig 70 (an example of a pressing portion) as illustrated in (B) in FIG. 10 (pressing step (S2)).

In detail, as illustrated in (A) and (B) in FIG. 10, solar cells 10 are pressed one by one by pressing jig 70 from one end (negative X-axis side) to the other end (positive X-axis side) of solar cell string 11. Here, the one end of solar cell string 11 is set as the reference side. First, the first solar cell 10 at the one end of solar cell string 11 is fixed by the first pressing jig 70. After this, the second solar cell 10 adjacent in the row direction is fixed by the second pressing jig 70. This step is performed for the number of solar cells 10. As a result, all solar cells 10 in solar cell string 11 are pressed on work table 90. In the case of attaching light reflection member 30 across the gap between adjacent two solar cell strings 11, since the number of solar cells 10 is 24, 24 pressing jigs 70 press solar cells 10 one by one. Alternatively, solar cell 10 in the center part of solar cell string 11 may be pressed first, followed by solar cells 10 in the column direction.

Although solar cell 10 is pressed by pressing jig 70 as an example of the pressing portion in the pressing step (S2) in this embodiment, this is not a limitation. Work table 90 on which solar cell string 11 is set may have a suction hole corresponding to each solar cell 10. Solar cell 10 is then placed on the suction hole of work table 90. Controller 102c may cause pump 102b to suck external air from the suction hole to adsorb solar cell 10, so as to press solar cell 10 against work table 90. Solar cell 10 is thus fixed to work table 90.

As illustrated in FIGS. 8, 9, and 11, light reflection member 30 is prepared on preparation table 91 beforehand, with resin adhesive 33 facing downward. Light reflection members 30 are arranged in a line at approximately regular intervals so that the longitudinal direction of light reflection member 30 is approximately parallel to the row direction in an XY planar view. In other words, light reflection members 30 are set on preparation table 91 in the state of being arranged in a line at approximately regular intervals so as to correspond to compression bonding heads 110 of arm portion 130 (light reflection member preparation step (S3)). In more detail, the interval between one end of light reflection member 30 in the positive X-axis direction and the other end of another light reflection member 30 adjacent to light reflection member 30 in the positive X-axis direction is approximately the same as the interval between one end of compression bonding head 110 in the positive X-axis direction and the other end of another compression bonding head 110 adjacent to compression bonding head 110 in the positive X-axis direction. Placement regions R1 equally have approximately the same intervals as these intervals.

As illustrated in FIG. 9, light reflection members 30 are vacuum adsorbed to preparation table 91. In detail, light reflection members 30 are sucked from a plurality of adsorption holes (not illustrated) formed in preparation table 91, to be attached and fixed to preparation table 91. The suction from the adsorption holes is performed by a pump or the like. Light reflection members 30 are thus placed at the positions corresponding to the adsorption holes.

Although the light reflection member preparation step (S3) is performed after the pressing step (S2) in this embodiment, the light reflection member preparation step (S3) may be performed before the string formation step (S1) or the pressing step (S2), as long as the light reflection member preparation step (S3) precedes the light reflection member placement step (S4). In this case, the pressing step (S2) is continuously performed between the light reflection member preparation step (S3) and the light reflection member attachment step (S5).

As illustrated in FIGS. 8, 9 and, 11, compression bonding device 100 is used to place light reflection member 30 in placement region R1 in adjacent two solar cell strings 11. Compression bonding device 100 places light reflection member 30 across the gap between adjacent two solar cells 10 set on work table 90, in the state of pressing each solar cell 10 by pressing jig 70 (light reflection member placement step (S4)). Here, non-thermocompression bonding portion 111 corresponds to the gap between adjacent two solar cells 10. In detail, compression bonding head 110 is situated so that first thermocompression bonding portion 112 and second thermocompression bonding portion 113 overlap the respective overlap regions and non-thermocompression bonding portion 111 overlaps the region of the gap between adjacent two solar cells 10 in an XY planar view of solar cells 10.

Detailed operation in the light reflection member placement step (S4) is as follows. Driver 102a moves compression bonding head 110 of arm portion 130 so as to come into contact with the upper surface of light reflection member 30 arranged on preparation table 91. When pump 102b sucks external air, light reflection member 30 is adsorbed to compression bonding head 110. Here, light reflection member 30 is held approximately horizontally in the state of being in contact with elastic portion 115 of each of first thermocompression bonding portion 112 and second thermocompression bonding portion 113 in compression bonding head 110. In this state, controller 102c operates driver 102a to move arm portion 130 approximately parallel to the column direction. In detail, driver 102a moves, via arm portion 130, light reflection member 30 approximately parallel to the column direction from preparation table 91 to placement region R1 in solar cell strings 11 set on work table 90, in the state where compression bonding head 110 holds light reflection member 30 approximately horizontally. In other words, compression bonding head 110 moves approximately parallel to the column direction and is located in placement region R1 corresponding to light reflection member 30.

Compression bonding head 110 sets light reflection member 30 in placement region R1. Here, controller 102c operates heat source portion 120, so that compression bonding head 110 is heated to the predetermined temperature by heat source portion 120. Controller 102c drives driver 102a to cause compression bonding head 110 to apply pressure downward via arm portion 130. Light reflection member 30 is thermocompression-bonded to solar cells 10 by first thermocompression bonding portion 112 and second thermocompression bonding portion 113, to be adhered to solar cells 10. In the state where solar cells 10 are pressed by pressing jigs 70, light reflection member 30 is attached to the ends of solar cells 10 (light reflection member attachment step (S5)). Thus, in an XY planar view, the overlap regions of light reflection member 30 and solar cells 10 are thermocompression-bonded while the region where non-thermocompression bonding portion 111 overlaps the region of the gap between adjacent two solar cells 10 is not thermocompression-bonded. Solar cell strings 11 to which light reflection members 30 are attached are thus obtained as illustrated in FIG. 11.

When aligning compression bonding head 110 and light reflection member 30 and aligning light reflection member 30 and placement region R1, compression bonding device 100 may measure the attachment accuracy of light reflection member 30 and feed the measured attachment accuracy back to the light reflection member placement step (S4) and the light reflection member attachment step (S5). In this case, the attachment accuracy of light reflection member 30 may be measured by image recognition using an imaging device such as a camera.

Controller 102c determines that the adhesion between light reflection member 30 and solar cells 10 is completed, after a predetermined time. Thus, solar cell strings 11 to which light reflection members 30 are adhered in placement regions R1 are obtained in the light reflection member attachment step (S5). Pressing jigs 70 are then removed.

As illustrated in FIGS. 8 and 12, solar cell strings 11 to which light reflection members 30 are adhered are set on stack table 93 different from work table 90. Stack body 80 including front surface protection member 40, front surface side resin sheet 6, solar cell strings 11 to which light reflection members 30 are adhered, back surface side resin sheet 6, and back surface protection member 50 is formed on stack table 93 (stack body formation step (S6)). In detail, front surface protection member 40, resin sheet 6, solar cell strings 11 to which light reflection members 30 are adhered, resin sheet 6, and back surface protection member 50 are stacked in this order on the upper surface of stack table 93.

Before the stack body formation step (S6), adjacent solar cell strings 11 obtained in the light reflection member attachment step (S5) may be connected by connection wiring 21 via wiring material 20. The connection by connection wiring 21 may be before or after the light reflection member attachment step (S5), or at the same time as the light reflection member attachment step (S5). Plurality of solar cell strings 11 are thus connected in series or in parallel to form a cell array. Stack body 80 is then obtained using solar cell strings 11 connected to light reflection members 30 and connection wiring 21.

Stack body 80 formed in the stack body formation step (S6) is thermocompression-bonded (lamination step (S7)). For example, stack body 80 is thermocompression-bonded (heated and compression bonded) in a vacuum at a temperature of 100° C. or more. As a result of the thermocompression bonding, resin sheet 6 is heated to melt into filling member 60 that seals solar cells 10. Solar cell module 1 is produced in this way.

Frame 7 is attached to solar cell module 1. In detail, frame 7 is fixed to the peripheral end of each of the four sides of solar cell module 1 using an adhesive such as silicon resin.

[Operations and Effects]

The operations and effects of the method of manufacturing solar cell module 1 in Embodiment 1 are described below.

As described above, the method of manufacturing solar cell module 1 according to Embodiment 1 includes: the light reflection member placement step (S4) of placing light reflection member 30 across a gap between adjacent two solar cells 10 set on work table 90; and the light reflection member attachment step (S5) of attaching light reflection member 30 to respective ends of adjacent two solar cells 10, by thermocompression-bonding respective overlap regions of light reflection member 30 with adjacent two solar cells 10 using compression bonding head 110 that includes: first thermocompression bonding portion 112 and second thermocompression bonding portion 113 each having contact surface 115b that comes into contact with light reflection member 30; and non-thermocompression bonding portion 111 interposed between first thermocompression bonding portion 112 and second thermocompression bonding portion 113 and not thermocompression-bonding light reflection member 30.

With this manufacturing method, first thermocompression bonding portion 112 and second thermocompression bonding portion 113 thermocompression-bond light reflection member 30 in the overlap regions of light reflection member 30 and solar cells 10, while non-thermocompression bonding portion 111 which is the region other than first thermocompression bonding portion 112 and second thermocompression bonding portion 113 does not thermocompression-bond light reflection member 30. Accordingly, when attaching light reflection member 30 to solar cells 10, light reflection member 30 is unlikely to adhere to work table 90 in the gap between adjacent two solar cells 10. The light reflection member attachment step (S5) thus does not interfere with the other manufacturing steps. This prevents damage to solar cell strings 11 caused by the adhesion of light reflection member 30 to work table 90, when moving solar cell strings 11 to which light reflection member 30 is adhered from work table 90.

It is therefore possible to prevent the light reflection member attachment step (S5) of attaching light reflection member 30 from interfering with the series of manufacturing steps, and prevent damage to solar cell strings 11. A decrease in yield is avoided when damage to solar cell strings 11 is prevented.

In the method of manufacturing solar cell module 1 according to Embodiment 1, in the light reflection member attachment step (S5), light reflection member 30 is attached to the respective ends of adjacent two solar cells 10 by placing compression bonding head 110 in a state where, in a planar view of adjacent two solar cells 10, first thermocompression bonding portion 112 and second thermocompression bonding portion 113 overlap the respective overlap regions and non-thermocompression bonding portion 111 overlaps a region of the gap between adjacent two solar cells 10.

With this manufacturing method, first thermocompression bonding portion 112 and second thermocompression bonding portion 113 overlap the overlap regions, and non-thermocompression bonding portion 111 overlaps the region of the gap between adjacent two solar cells 10. Since non-thermocompression bonding portion 111 corresponds to the gap between adjacent two solar cells 10, light reflection member 30 corresponding to non-thermocompression bonding portion 111 is unlikely to adhere to work table 90. This ensures that light reflection member 30 is kept from adhering to work table 90.

The method of manufacturing solar cell module 1 according to Embodiment 1 further includes, before the light reflection member placement step (S4): the string formation step (S1) of forming solar cell string 11 by connecting plurality of solar cells 10 linearly arranged in a row direction by wiring material 20, plurality of solar cells 10 including any of adjacent two solar cells 10; and the pressing step (S2) of pressing each of plurality of solar cells 10 in solar cell string 11 formed in the string formation step (S1), by pressing jig 70, wherein the pressing step (S2) is continuously performed between the light reflection member preparation step (S3) and the light reflection member attachment step (S5).

With this manufacturing method, solar cells 10 are pressed by pressing jigs 70, so that solar cell string 11 can be fixed to work table 90 while preventing solar cell string 11 from warping. This resolves unevenness due to warping of each solar cell string 11, and enables accurate attachment of light reflection member 30 across the gap between adjacent two solar cell strings 11.

In the method of manufacturing solar cell module 1 according to Embodiment 1, in the pressing step (S2), plurality of solar cells 10 are sequentially pressed by pressing jigs 70 in the row direction of solar cell string 11.

With this manufacturing method, solar cells 10 are pressed sequentially by pressing jigs 70 from one end to the other end of solar cell string 11 (in the row direction), and so warping of solar cell string 11 can be prevented more easily. This resolves unevenness due to warping of each solar cell string 11 more easily, and enables more accurate attachment of light reflection member 30 to solar cells 11. In particular, since pressing jigs 70 press solar cells 10 in sequence, solar cell string 11 is unlikely to be under stress.

The method of manufacturing solar cell module 1 according to Embodiment 1 further includes the lamination step (S7) of stacking front surface protection member 40, resin sheet 6, solar cell string 11, resin sheet 6, and back surface protection member 50 in the stated order to form stack body 80 and thermocompression bonding stack body 80, after the light reflection member attachment step (S5).

With this manufacturing method, front surface protection member 40, resin sheet 6, solar cell string 11 to which light reflection member 30 is adhered, resin sheet 6, and back surface protection member 50 are stacked in this order to form stack body 80, so that light reflection member 30 is unlikely to adhere to front surface protection member 40, back surface protection member 50, or resin sheet 6. This prevents damage to solar cell string 11 caused by the adhesion of light reflection member 30, when moving solar cell string 11 from work table 90 to another stack table 93 in order to form stack body 80. In particular, since the light reflection member attachment step (S5) is performed before the formation of stack body 80, even when any solar cell 10 is damaged, the damaged part can be replaced. A decrease in yield can thus be avoided.

In the method of manufacturing solar cell module 1 according to Embodiment 1, compression bonding head 110 has suction hole 114 for adsorbing light reflection member 30, and in the light reflection member placement step (S4), light reflection member 30 is adsorbed to suction hole 114 and placed across the gap between adjacent two solar cells 10.

With this manufacturing method, light reflection member 30 can be placed easily when moving light reflection member 30 from preparation table 91 to the position across the gap between adjacent two solar cells 10.

In the method of manufacturing solar cell module 1 according to Embodiment 1, each of first thermocompression bonding portion 112 and second thermocompression bonding portion 113 has elastic portion 115 that comes into contact with light reflection member 30.

With this manufacturing method, when compression bonding head 110 adsorbs light reflection member 30, elastic portion 115 keeps light reflection member 30 from being damaged. A decrease in yield can thus be avoided more effectively.

In the method of manufacturing solar cell module 1 according to Embodiment 1, compression bonding head 110 has a long shape, and has groove portion 116 formed by non-thermocompression bonding portion 110 with respect to two first thermocompression bonding portion 112 and second thermocompression bonding portion 113.

With this manufacturing method, the use of compression bonding head 110 having groove portion 116 eases the thermocompression-bonding of light reflection member 30 to solar cells 10 across the gap between adjacent two solar cells 10. Manufacturing cost can be reduced in this way.

In particular, compression bonding head 110 is U-shaped, which can be produced easily.

(Variation of Embodiment 1)

In a variation of Embodiment 1, the structure of solar cell module 1 is the same as that of solar cell module 1 in Embodiment 1, and the same structural elements are given the same reference marks and their detailed description is omitted.

[Manufacturing Method: 1-1-1. Structure of Compression Bonding Device]

The difference of the variation of Embodiment 1 from Embodiment 1 lies in compression bonding head 110 in compression bonding device 100. The structure of compression bonding head 110 in compression bonding device 100 is described below, with reference to FIG. 13.

FIG. 13 is a sectional view illustrating compression bonding head 110 in compression bonding device 100 according to the variation of Embodiment 1 along line VI-VI in FIG. 5.

As illustrated in FIG. 13, plurality of suction holes 114 formed in compression bonding head 110 are located in non-thermocompression bonding portion 111, first thermocompression bonding portion 112, and second thermocompression bonding portion 113.

In detail, suction hole 114 includes first communication hole 111$a$ and second communication hole 111$b$ in non-thermocompression bonding portion 111. First communication hole 111$a$ extends downward from the upper surface of non-thermocompression bonding portion 111. Second communication hole 111$b$ communicates with first communication hole 111$a$, and extends in the column direction from the lower end of first communication hole 111$a$.

Suction hole 114 includes third communication hole 112$a$ and fourth communication hole 113$a$ in first thermocompression bonding portion 112 and second thermocompression bonding portion 113. Third communication hole 112$a$ extends upward from the lower end surface of first thermocompression bonding portion 112, and is connected to the positive Y-axis end side of second communication hole 111$b$. Fourth communication hole 113$a$ extends upward from the lower end of second thermocompression bonding portion 113, and is connected to the negative Y-axis end side of second communication hole 111$b$.

Suction hole 114 includes through hole 115$a$ in elastic portion 115. Through hole 115$a$ is formed to correspond to each of third communication hole 112$a$ and fourth communication hole 113$a$.

When pump 102$b$ sucks air, compression bonding head 110 holds light reflection member 30 approximately horizontally by first thermocompression bonding portion 112 and second thermocompression bonding portion 113 via elastic portions 115.

The method of manufacturing solar cell module 1 is the same as the method of manufacturing solar cell module 1 in Embodiment 1, and so its detailed description is omitted.

The operations and effects of the method of manufacturing solar cell module 1 are the same as the operations and effects of the method of manufacturing solar cell module 1 in Embodiment 1, and so their detailed description is omitted.

Embodiment 2

In Embodiment 2, the structure of solar cell module 1 is the same as that of solar cell module 1 in Embodiment 1, and the same structural elements are given the same reference marks and their detailed description is omitted.

[Manufacturing Method: 2-1. Structure of Compression Bonding Device]

Compression bonding device 200 is used in the manufacture of solar cell module 1. The structure of compression bonding device 200 is described first, with reference to FIG. 14.

(A) in FIG. 14 is an explanatory diagram illustrating the state of thermocompression-bonding light reflection member 30 to solar cells 10 using compression bonding roller 210, in the method of manufacturing solar cell module 1 according to Embodiment 2. (B) in FIG. 14 is a sectional view illustrating compression bonding roller 210 in compression bonding device 200 according to Embodiment 2 along line XIVB-XIVB in (A) in FIG. 14. (A) in FIG. 14 illustrates the state where light reflection member 30 is thermocompression-bonded to solar cells 10 using compression bonding roller 210 in solar cell strings 11 to which light reflection member 30 is adhered in FIG. 11, along line XIVA-XIVA in FIG. 11.

In Embodiment 2, the same structural elements of compression bonding device 200 as those of compression bonding device 100 in Embodiment 1 are given the same reference marks and their detailed description is omitted.

The difference of compression bonding device 200 in Embodiment 2 from compression bonding device 100 in Embodiment 1 lies in that the compression bonding head in Embodiment 2 is a roller whereas compression bonding head 110 in Embodiment 1 is a long member which is U-shaped in cross section. Moreover, while compression bonding head 110 in Embodiment 1 performs the light reflection member placement step (S4), compression bonding roller 210 in Embodiment 2 does not perform the light reflection member placement step (S4).

As illustrated in FIGS. 7 and 14, compression bonding device 200 includes conveyor 101 and device main body 102.

Conveyor 101 includes a plurality of movable heads and an arm portion. Each movable head has the same structure as compression bonding head 110 in Embodiment 1, except that it is not provided with heat source portion 120 in Embodiment 1. The movable head places light reflection member 30 across the gap between adjacent two solar cells 10. The arm portion in this embodiment has the same structure as arm portion 130 in Embodiment 1.

Device main body 102 includes controller 102c that controls compression bonding roller 210, driver 102a, heat source portion 120, etc.

Compression bonding roller 210 includes non-thermocompression bonding portion 211, first thermocompression bonding portion 212, and second thermocompression bonding portion 213. Storage portion 210a is formed in compression bonding roller 210.

Non-thermocompression bonding portion 211 is annular, and forms storage portion 210a on its inner peripheral side. Non-thermocompression bonding portion 211 is rotatable about rotation axis X1. Heat source portion 120 is provided in storage portion 210a of non-thermocompression bonding portion 211. Heat source portion 120 is capable of heating the inner peripheral surface of non-thermocompression bonding portion 211. Pump 102b may be stored in storage portion 210a.

Annular first thermocompression bonding portion 212 and annular second thermocompression bonding portion 213 are formed on the outer peripheral surface of non-thermocompression bonding portion 211. First thermocompression bonding portion 212 is an annular portion projecting radially outward from the outer peripheral edges of one side of non-thermocompression bonding portion 211. Second thermocompression bonding portion 213 is an annular portion projecting radially outward from the outer peripheral edges of the other side of non-thermocompression bonding portion 211. Annular groove 210b is formed by the facing surfaces of first thermocompression bonding portion 212 and second thermocompression bonding portion 213 and the outer peripheral surface of non-thermocompression bonding portion 211. First thermocompression bonding portion 212, second thermocompression bonding portion 213, and non-thermocompression bonding portion 211 thus form annular groove 210b which is an annular depression. Although annular groove 210b is hollow in this embodiment, annular groove 210b may be filled with such a material with low heat conductivity that does not thermocompression-bond light reflection member 30 to solar cell 10. In this case, the part filled with the material with low heat conductivity is also non-thermocompression bonding portion 211.

Driver 102a moves compression bonding device 200 in the row direction at a constant speed. Compression bonding roller 210 in compression bonding device 200 rolls on the upper surfaces of solar cell strings 11 on which light reflection members 30 are placed, to move from one end to the other end of solar cell strings 11. Although compression bonding roller 210 moves from one end to the other end of solar cell strings 11 in FIG. 14, compression bonding roller 210 may move in the opposite direction. Moreover, instead of driver 102a moving compression bonding device 200 in the row direction, a drive device for moving work table 90 in the row direction may be used.

[Manufacturing Method: 2-2. Method of Manufacturing Solar Cell Module]

The method of manufacturing solar cell module 1 is described next.

In Embodiment 2, the same steps of the method of manufacturing solar cell module 1 as those of the method of manufacturing solar cell module 1 in Embodiment 1 are given the same reference marks and their detailed description is omitted.

In this embodiment, the string formation step (S1) to the pressing step (S2) are the same as those of the method of manufacturing solar cell module 1 in Embodiment 1, and so their description is omitted.

After the pressing step (S2), compression bonding roller 210 rolls to move from one end to the other end of solar cell strings 11 on which light reflection members 30 are placed (light reflection member attachment step (S5)). In this embodiment, compression bonding roller 210 rolls to move from the negative X-axis side to positive X-axis side of solar cell strings 11.

In detail, compression bonding roller 210 is positioned at one end of solar cell strings 11 on which light reflection members 30 are placed. Here, compression bonding roller 210 is positioned so that, when moving compression bonding roller 210, first thermocompression bonding portion 212 of compression bonding roller 210 passes the part where solar cells 10 on one side and light reflection members 30 overlap in the row direction and second thermocompression bonding portion 213 of compression bonding roller 210 passes the part where solar cells 10 on the other side and light reflection members 30 overlap in the row direction. In other words, compression bonding roller 210 is placed so that first thermocompression bonding portion 212 and second thermocompression bonding portion 213 approximately coincide with the parts where the light reflection member 30 lies over (overlaps) adjacent two solar cells 10 and non-thermocompression bonding portion 211 approximately coincides with the gap between adjacent two solar cells 10 in an XY planar view.

Compression bonding roller 210 in compression bonding device 200 moves from one end to the other end of solar cell strings 11 on which light reflection members 30 are placed, while thermocompression-bonding solar cells 10 and light reflection members 30 (light reflection member attachment step (S5)). Each light reflection member 30 is thus adhered to the parts of solar cells 10 overlapping light reflection member 30, as a result of which solar cell strings 11 to which light reflection members 30 are adhered is obtained.

Solar cell module 1 is then produced by the same method as the lamination step (S7) in the method of manufacturing solar cell module 1 in Embodiment 1.

Although compression bonding roller 210 moves in the row direction to thermocompression-bond light reflection members 30 and solar cells 10 in the light reflection member attachment step (S5) in this embodiment, not compression bonding roller 210 but work table 90 may be moved in the row direction to thermocompression-bond solar cells 10 and light reflection members 30. This is realized, for example, by a belt conveyor including a drive device for moving work table 90.

[Operations and Effects]

The operations and effects of the method of manufacturing solar cell module 1 in this embodiment are described below.

As described above, in the method of manufacturing solar cell module 1 according to Embodiment 2, compression bonding head 110 is a roller (compression bonding roller 210), and has annular groove 210b formed by non-thermocompression bonding portion 211 with respect to first thermocompression bonding portion 212 and second thermocompression bonding portion 213.

With this manufacturing method, compression bonding device 200 including compression bonding roller 210 is smaller in size than the compression bonding device using long compression bonding head 110.

The other operations and effects of the method of manufacturing solar cell module 1 are the same as those of the method of manufacturing solar cell module 1 in Embodiment 1, and so their detailed description is omitted.

(Variation of Embodiment 2)

In a variation of Embodiment 2, the structure of solar cell module 1 is the same as that of solar cell module 1 in Embodiment 2, and the same structural elements are given the same reference marks and their detailed description is omitted.

[Manufacturing Method: 2-1-1. Structure of Compression Bonding Device]

Compression bonding device 200 is used in the manufacture of solar cell module 1. The structure of compression bonding device 200 is described first, with reference to FIG. 15.

FIG. 15 is an explanatory diagram illustrating the state of thermocompression-bonding light reflection member 30 to solar cells 10 using compression bonding roller 210, in the method of manufacturing solar cell module 1 according to the variation of Embodiment 2. FIG. 15 illustrates the state where light reflection member 30 is thermocompression-bonded to solar cells 10 using compression bonding roller 210 in solar cell strings 11 on which light reflection member 30 is placed in FIG. 11, along line XV-XV in FIG. 9.

In the variation of Embodiment 2, the same structural elements of compression bonding device 200 as those of compression bonding device 200 in Embodiment 2 are given the same reference marks and their detailed description is omitted.

The difference of compression bonding device 200 in the variation of Embodiment 2 from compression bonding device 200 in Embodiment 2 lies in that compression bonding device 200 in the variation of Embodiment 2 includes: bobbin 221 on which light reflection tape 3 as a source of light reflection member 30 is wound; feed roller 222; pair of conveyance rollers 223; and cutter 224, and that compression bonding device 200 in the variation of Embodiment 2 does not include conveyor 101 in Embodiment 2.

As illustrated in FIG. 15, compression bonding device 200 includes conveyor 201, housing 202, bobbin 221, and cutter 224, in addition to compression bonding roller 210, driver 102a, and controller 102c. Housing 202 stores compression bonding roller 210, driver 102a, controller 102c, conveyor 201, bobbin 221, cutter 224, and discharge roller 226.

Conveyance path P1 is formed in conveyor 201. Conveyor 201 includes feed roller 222, pair of conveyance rollers 223, cutter 224, mount pad 225, and discharge roller 226. Feed roller 222, pair of conveyance rollers 223, and discharge roller 226 are supported by housing 202 so as to be rotatable by driver 102a.

Conveyance path P1 is made up of the path from bobbin 221 on which light reflection tape 3 is wound to feed roller 222, the path from feed roller 222 to pair of conveyance rollers 223, the path from pair of conveyance rollers 223 to cutter 224, and the path from cutter 224 to mount pad 225 and discharge roller 226. In conveyance path P1, the bobbin 221 side is the upstream side, and the mount pad 225 and discharge roller 226 side is the downstream side. Light reflection tape 3 is conveyed in the conveyance direction (arrow direction) in conveyance path P1.

Bobbin 221 is located on the upstream side of conveyance path P1. Light reflection tape 3 is wound on bobbin 221. Feed roller 222 is located downstream of bobbin 221. Feed roller 222 rotates to convey light reflection tape 3 wound on bobbin 221 in the conveyance direction. Pair of conveyance rollers 223 are located downstream of feed roller 222. Pair of conveyance rollers 223 rotate to convey light reflection tape 3 conveyed from feed roller 222 in the conveyance direction. Cutter 224 for cutting light reflection tape 3 is located downstream of pair of conveyance rollers 223. Cutter 224 cuts light reflection tape 3 to a predetermined length, to form light reflection member 30. Mount pad 225 and discharge roller 226 for placing light reflection member 30 in placement region R1 in adjacent two solar cells 10 in FIG. 5 are located downstream of cutter 224. Mount pad 225 and discharge roller 226 discharge light reflection member 30.

A light sensor (not illustrated) for detecting the length of light reflection member 30 is provided near cutter 224. The light sensor sends the detection signal to controller 102c. Controller 102c performs control to cut light reflection member 30 to the predetermined length, according to the detection signal of the light sensor. In this embodiment, light reflection member 30 is cut to an approximately equal length.

Controller 102c controls the moving speed of compression bonding device 200 by driver 102a. Compression bonding device 200 moves on solar cell strings 11 set on work table 90 and pressed in the pressing step (S2), at a constant speed in the scan direction. The scan direction in this embodiment is the direction in which compression bonding device 200 travels, i.e. the direction parallel to the row direction. Although compression bonding device 200 moves from the other end (positive X-axis side) to one end (negative X-axis side) of solar cell strings 11 in FIG. 15, compression bonding device 200 may move in the opposite direction.

Controller 102c controls, via driver 102a, the rotations of compression bonding roller 210, feed roller 222, pair of conveyance rollers 223, and discharge roller 226 and the cutting operation of cutter 224 so that light reflection members 30 are arranged in a line at approximately regular intervals in placement regions R1 in solar cell strings 11 in FIG. 11 pressed by pressing jigs 70 in the pressing step (S2). For example, when placing light reflection members 30 in placement regions R1 in FIG. 11 by mount pad 225 and discharge roller 226, controller 102c performs control so that the moving speed of compression bonding device 200 and the rotation speed of the outer peripheral surface of discharge roller 226 are approximately the same and that discharge roller 226 and the like are stopped in the region between two placement regions R1 in FIG. 11 adjacent in the row direction. The region between adjacent two placement regions R1 in FIG. 11 is a region where light reflection member 30 is not attached, and corresponds to the part surrounded by the corners of four solar cells 10 except solar cells 10 of outermost solar cell strings 11.

By using such compression bonding device 200 in the manufacture of solar cell module 1, light reflection member 30 can be placed across the gap between adjacent two solar cells 10 without preparing light reflection member 30 on preparation table 91 in FIG. 11 as in Embodiment 1. Moreover, compression bonding device 200 does not need to include the arm portion in FIG. 5 as in Embodiment 1. Thus, not only the step of preparing light reflection member 30 on preparation table 91 is omitted, but also compression bonding device 200 is smaller in size.

In the variation of Embodiment 2, the other steps of the method of manufacturing solar cell module 1 are the same as those of the method of manufacturing solar cell module 1 according to Embodiment 2, and so their detailed description is omitted.

In the variation of Embodiment 2, the operations and effects of the method of manufacturing solar cell module 1 are the same as the operations and effects of the method of manufacturing solar cell module 1 in Embodiment 1, and so their detailed description is omitted.

Embodiment 3

In Embodiment 3, the structure of solar cell module 1 is the same as that of solar cell module 1 in Embodiment 1, and the same structural elements are given the same reference marks and their detailed description is omitted.

Compression bonding device 300 is used in the manufacture of solar cell module 1. The structure of compression bonding device 300 is described first, with reference to FIGS. 16 and 17.

FIG. 16 is a perspective view illustrating compression bonding device 300 and solar cell strings 11 according to Embodiment 3. (A) in FIG. 17 is an enlarged perspective view illustrating compression bonding head 310 in compression bonding device 300 according to Embodiment 3. (B) in FIG. 17 is an enlarged perspective view illustrating compression bonding head 310 in compression bonding device 300 according to Embodiment 3. (A) in FIG. 17 is a perspective view of compression bonding head 310 as viewed obliquely from above. (B) in FIG. 17 is a perspective view of compression bonding head 310 as viewed obliquely from below.

This embodiment differs from Embodiment 1, etc. in that contact surfaces 312a and 313a of first thermocompression bonding portion 312 and second thermocompression bonding portion 313 of each compression bonding head 310 are provided discretely, and that movable table 401 is used instead of preparation table 91.

[Manufacturing Method: 3-1. Structure of Compression Bonding Device]

In this embodiment, the same structural elements of compression bonding device 300 as those of compression bonding device 100 in Embodiment 1 are given the same reference marks, and their detailed description is omitted.

First thermocompression bonding portion 312 and second thermocompression bonding portion 313 of each compression bonding head 310 have notch 310a that extends in the positive Z-axis direction from the end surface (the below-mentioned contact surfaces 312a and 313a) in the negative Z-axis direction and passes through the thermocompression bonding portion in the Y-axis direction. By forming notch 310a, a plurality of columnar structures extending in the Z-axis direction are formed in first thermocompression bonding portion 312 and second thermocompression bonding portion 313 of compression bonding head 310. The columnar structures in first thermocompression bonding portion 312 and second thermocompression bonding portion 313 are located discretely.

Notch 310a is formed in first thermocompression bonding portion 312 and second thermocompression bonding portion 313 so that the outside of compression bonding head 310 and groove portion 116 of compression bonding head 310 communicate with each other. The number of columnar structures in first thermocompression bonding portion 312 and second thermocompression bonding portion 313 is at least two. In other words, the number of notches 310a is at least one. In this embodiment, three columnar structures are provided in each of first thermocompression bonding portion 312 and second thermocompression bonding portion 313.

In this embodiment, the columnar structures of first thermocompression bonding portion 312 are arranged at regular intervals in the X-axis direction, on the positive Y-axis direction edge side of heat source portion 120. The columnar structures of second thermocompression bonding portion 313 are arranged at regular intervals in the X-axis direction, on the negative Y-axis direction edge side of heat source portion 120. Elastic portion 315 is provided on the lower end surfaces of the columnar structures in each of first thermocompression bonding portion 312 and second thermocompression bonding portion 313. Elastic portion 315 is provided to correspond to the shape of each of first thermocompression bonding portion 312 and second thermocompression bonding portion 313, and otherwise has the same structure as elastic portion 115 in Embodiment 1.

Elastic portions 315 (contact surfaces 312a and 313a) provided on the lower end surfaces of the columnar structures in first thermocompression bonding portion 312 and second thermocompression bonding portion 313 come into contact with the overlap regions of light reflection member 30 and solar cells 10 in the light reflection member attachment step (S5). Meanwhile, the regions where plurality of first thermocompression bonding portion 312 and plurality of second thermocompression bonding portion 313 do not come into contact with the overlap regions are noncontact surfaces 312b and 313b. Thus, the lower surfaces of elastic portions 315 are contact surfaces 312a and 313a, and the parts of first thermocompression bonding portion 312 and second thermocompression bonding portion 313 where notch 310a is formed are noncontact surfaces 312b and 313b.

In this embodiment, the columnar structures of each of first thermocompression bonding portion 312 and second thermocompression bonding portion 313 are provided at both ends of compression bonding head 310 in the X-axis direction. In other words, notch 310a is formed in the part other than both ends of each of first thermocompression bonding portion 312 and second thermocompression bonding portion 313. First thermocompression bonding portion 312 and second thermocompression bonding portion 313 thermocompression-bond both ends of the respective overlap regions in the light reflection member attachment step (S5).

First thermocompression bonding portion 312 and second thermocompression bonding portion 313 of each compression bonding head 310 respectively have contact surfaces 312a and 313a that come into contact with the overlap regions of light reflection member 30 and solar cells 10 and noncontact surfaces 312b and 313b that do not come into contact with the overlap regions of light reflection member 30 and solar cells 10.

Contact surface 312a is the lower end surface of elastic portion 315 provided on the lower end surface of first thermocompression bonding portion 312, and comes into contact with the overlap region of light reflection member 30 and solar cell 10. Contact surface 313a is the lower end surface of elastic portion 315 provided on the lower end surface of second thermocompression bonding portion 313, and comes into contact with the overlap region of light reflection member 30 and solar cell 10. Noncontact surfaces 312b and 313b are the upper end surfaces (end surfaces in the positive Z-axis direction) of respective first thermocompression bonding portion 312 and second thermocompression bonding portion 313, and each do not come into contact with the overlap region of light reflection member 30 and solar cell 10. In this embodiment, noncontact surfaces 312b and 313b are flush with non-thermocompression bonding portion 111.

In this embodiment, the region between adjacent two columnar members in first thermocompression bonding portion 312 is noncontact surface 312b, and the region between adjacent two columnar members in second thermocompression bonding portion 313 is noncontact surface 313b.

When contact surfaces 312a and 313a are brought into contact with the overlap regions to thermocompression-bond light reflection member 30 to solar cells 10, compression bonding head 310 thermocompression-bonds part of the overlap regions and does not thermocompression-bond the remaining part of the overlap regions. In detail, in the regions where contact surfaces 312a and 313a overlap the overlap regions, light reflection member 30 is thermocompression-bonded to solar cells 10. In the regions where noncontact surfaces 312b and 313b overlap the overlap regions, on the other hand, light reflection member 30 is not thermocompression-bonded to solar cells 10.

First thermocompression bonding portion 312 and second thermocompression bonding portion 313 each have three or more contact surfaces 312a or 313a. Each of contact surfaces 312a or 313a may differ in temperature. For example, contact surfaces 312a or 313a located at both ends of the overlap region may be higher in temperature than contact surface(s) 312a or 313a not located at both ends of the overlap region. Thus, contact surfaces 312a or 313a located at both ends of the overlap region are higher in temperature than other contact surface(s) 312a or 313a. In detail, the columnar structures of each of first thermocompression bonding portion 312 and second thermocompression bonding portion 313 provided at both ends of compression bonding head 310 in the X-axis direction are higher in temperature than the other columnar structure(s). Contact surfaces 312a or 313a at both ends of the overlap region may be at about 180° C., and other contact surface(s) 312a or 313a at about 70° C. to 120° C. In this case, the corner parts of light reflection member 30 are adhered to solar cell 10 in the light reflection member attachment step (S5).

To set both ends of compression bonding head 310 in the X-axis direction to be higher in temperature, for example, plurality of heat source portions 120 may be used to set both ends in the X-axis direction to be higher in temperature and the other parts to be lower in temperature, thus varying the temperature of each individual contact surface 312a or 313a. In the case of using one heat source portion 120, the material of the columnar structures of each of first thermocompression bonding portion 312 and second thermocompression bonding portion 313 at both ends in the X-axis direction may have higher heat conductivity than the material of the other columnar structure(s) of the thermocompression bonding portion.

In this embodiment, the columnar structures which are part of each of first thermocompression bonding portion 312 and second thermocompression bonding portion 313 are located at both ends of compression bonding head 310 in the X-axis direction, and so contact surfaces 312a or 313a are also located at both ends (both ends in the X-axis direction) of the overlap region. In this case, the corner parts of light reflection member 30 can be thermocompression-bonded in the light reflection member attachment step (S5). Although the columnar structures which are part of each of first thermocompression bonding portion 312 and second thermocompression bonding portion 313 are located at both ends of compression bonding head 310 in the X-axis direction in this example, the positions of the columnar structures are not particularly limited.

Third communication hole 312c is formed in each first thermocompression bonding portion 312. Third communication hole 312c communicates with second communication hole 111b of non-thermocompression bonding portion 111 in FIG. 13. Fourth communication hole 313c is formed in each second thermocompression bonding portion 313. Fourth communication hole 313c communicates with second communication hole 111b of non-thermocompression bonding portion 111.

Instead of forming notch 310a, elastic portion 315 may be provided discretely on each of first thermocompression bonding portion 312 and second thermocompression bonding portion 313. In detail, plurality of elastic portions 315 are provided discretely on the lower end surface of each of first thermocompression bonding portion 312 and second thermocompression bonding portion 313. In this case, merely providing elastic portion 315 discretely makes it possible to reduce the area of the load by which light reflection member 30 is attached to solar cell 10.

[Manufacturing Method: 3-2. Structure of Preparation Table]

Preparation table 400 is used in the manufacture of solar cell module 1. The structure of preparation table 400 is described below, with reference to FIG. 18. FIG. 18 is a perspective view of preparation table 400 and light reflection members 30 according to Embodiment 3. Although movable tables 401 in one line are illustrated in FIG. 18, this is not a limitation, and movable tables 401 may be arranged in a plurality of lines.

Preparation table 400 includes plurality of movable tables 401, body portion 402, and a drive mechanism.

Plurality of movable tables 401 are provided on the upper surface of body portion 402, and are capable of carrying plurality of light reflection members 30. Movable tables 401 are arranged in a line in the X-axis direction. Plurality of light reflection members 30 are placed in a one-to-one correspondence on plurality of movable tables 401. In this embodiment, each movable table 401 has approximately the same shape as light reflection member 30 when movable table 401 on which light reflection member 30 is set is viewed from above. Plurality of movable tables 401 make desired movement on the upper surface of body portion 402. For example, plurality of movable tables 401 move so that light reflection members 30 and placement regions R1 overlap (correspond to) each other on the Y axis.

Each movable table 401 moves in the X-axis direction so that there is a predetermined interval between adjacent two light reflection members 30. The predetermined interval is the interval between adjacent two placement regions R1 in the X-axis direction. Plurality of movable tables 401 move so as to ensure approximately the same interval as the interval between adjacent two placement regions R1 in the X-axis direction. In other words, the interval between adjacent two movable tables 401 is adjusted according to the interval between placement regions R1.

Although preparation table 400 is provided in the positive Y-axis direction of work table 90 in this embodiment, preparation table 400 may be provided in the X-axis direction of work table 90. In this case, plurality of movable tables 401 move on body portion 402 so that light reflection members 30 and placement regions R1 correspond on the X axis. In detail, plurality of movable tables 401 move on body portion 402 so that the interval between adjacent two light reflection members 30 is approximately the same as the interval between adjacent two placement regions R1 in the X-axis direction in which placement regions R1 are arranged. In other words, plurality of movable tables 401 adjust the positions of adjacent two light reflection members 30 according to the interval between plurality of compression bonding heads 310 in compression bonding device 100.

Each movable table 401 may include a suction hole for preventing misalignment of light reflection member 30 set on movable table 401.

Body portion 402 is a base for supporting movable tables 401, and stores a drive mechanism, a controller, a power source, etc. for moving plurality of movable tables 401. The drive mechanism, the controller, and the power source may be included in movable tables 401.

The drive mechanism is a device that moves movable tables 401 by a desired distance, and is an electrical actuator as an example. The moving distance, moving speed, etc. of movable tables 401 by the drive mechanism are adjusted by the controller or the like.

[Manufacturing Method: 3-3. Method of Manufacturing Solar Cell Module]

The method of manufacturing solar cell module 1 is described below, with reference to FIGS. 19 to 21. FIG. 19 is a flowchart of the method of manufacturing solar cell module 1 according to Embodiment 3. FIG. 20 is an explanatory diagram illustrating a movement step (S11) in the method of manufacturing solar cell module 1 according to Embodiment 3. FIG. 21 is an explanatory diagram illustrating the light reflection member placement stop (S4) and the lamination step (S7) in the method of manufacturing solar cell module 1 according to Embodiment 3. The same steps of the method of manufacturing solar cell module 1 as those in Embodiment 1 are given the same reference signs, and their description is omitted.

As illustrated in FIGS. 19 and 20, the light reflection member preparation step (S3) is performed after the string formation step (S1) and the pressing step (S2). In the light reflection member preparation step (S3), plurality of light reflection members 30 are set on plurality of movable tables 401 in a one-to-one correspondence. Although light reflection members 30 and movable tables 40 are arranged in a line in the X-axis direction in the drawings in this embodiment, light reflection members 30 and movable tables 40 may be arranged in a plurality of lines. In solar cell module 1 in this embodiment, 12 placement regions R1 in the X-axis direction are provided for 5 lines in the Y-axis direction. 60 movable tables 401 may be provided to enable light reflection members 30 to be placed in these 60 placement regions R1 all at once.

After the light reflection member preparation step (S3), movable tables 401 move to correspond to plurality of placement regions R1 in which plurality of light reflection members 30 are to be placed. In detail, one movable table 401 carries one light reflection member 30, and plurality of movable tables 401 move on body portion 402 to correspond to placement regions R1 arranged at intervals in the X-axis direction (movement step (S11)). The interval between adjacent two light reflection members 30 of plurality of light reflection members 30 in the X-axis direction is thus adjusted according to the interval between placement regions R1. In other words, the interval (width) between adjacent two light reflection members 30 is approximately the same as the interval between placement regions R1 in the X-axis direction.

In the case where light reflection members 30 are provided in a plurality of lines, one movable table 401 may carry one light reflection member 30, and plurality of movable tables 401 may move on body portion 402 so that plurality of light reflection members 30 correspond to placement regions R1 arranged in a matrix (movement step (S11)). Here, plurality of light reflection members 30 may be arranged in a matrix. As a result, plurality of light reflection members 30 are placed according to the interval between plurality of compression bonding heads 310 in compression bonding device 300 in the X-axis direction and the Y-axis direction, so that plurality of compression bonding heads 310 can adsorb plurality of light reflection members 30 in a one-to-one correspondence in the light reflection member placement step (S4). Hence, each light reflection member 30 can be placed in placement region R1 across the gap between adjacent two solar cells 10.

As illustrated in FIG. 21, in the light reflection member attachment step (S5) after the light reflection member placement step (S4), light reflection member 30 is attached to the placement region R1 in adjacent two solar cells 10 so that compression bonding head 310 does not crush resin adhesive 33 of light reflection member 30. The force applied to light reflection member 30 by compression bonding head 310 when attaching light reflection member 30 to placement region R1 in adjacent two solar cells 10 in the light reflection member attachment step (S5) is the same as that in Embodiment 1, etc. Accordingly, the area of the load on the overlap region is reduced by noncontact surfaces 312b and 313b in the light reflection member attachment step (S5), as compared with Embodiment 1, etc.

In the lamination step (S7) after the stack body formation step (S6), the stack body formed in the stack body formation step (S6) is thermocompression-bonded. Here, resin adhesive 33 of light reflection member 30 is crushed to further ensure the adhesion between light reflection member 30 and solar cells 10.

Thus, light reflection member 30 is locally thermocompression-bonded to solar cells 10 in the light reflection member attachment step (S5), and firmly attached to solar cells 10 in the lamination step (S7). Solar cell module 1 is obtained in this way.

[Operations and Effects]

The operations and effects of the method of manufacturing solar cell module 1 in this embodiment are described below.

As described above, in the method of manufacturing solar cell module 1 according to Embodiment 3, each of first thermocompression bonding portion 312 and second thermocompression bonding portion 313 further has noncontact surface 312b or 313b that does not come into contact with a corresponding one of the overlap regions, and in the light reflection member attachment step (S5), each of first thermocompression bonding portion 312 and second thermocompression bonding portion 313 thermocompression-bonds a part of the overlap region, while non-thermocompression bonding portion 111 keeps a remaining part of the overlap portion from being thermocompression-bonded.

In the case where each of first thermocompression bonding portion 312 and second thermocompression bonding portion 313 thermocompression-bond the entire overlap region in the light reflection member attachment step (S5), there is a possibility that solar cell 10 is damaged due to the load on light reflection member 30 and solar cell 10. In view of this, the area of the load on solar cell 10 is reduced to reduce the load applied to compression bonding head 310, thus preventing damage to solar cell 10.

In particular, for example in the case where the load when thermocompression-bonding reflection member 30 to the overlap region with solar cell 10 in the light reflection member attachment step (S5) is 100 N or less, damage to solar cell 10 can be prevented more reliably. Since compression bonding head 310 has contact surfaces 312a and 313a and noncontact surfaces 312b and 313b, the area of the load when thermocompression-bonding reflection member 30 to the overlap region with solar cell 10 in the light reflection member attachment step (S5) can be reduced. This prevents damage to solar cell 10, and avoids a decrease in yield of solar cell module 1.

In the method of manufacturing solar cell module 1 according to Embodiment 3, contact surface 312a or 313a in each of first thermocompression bonding portion 312 and second thermocompression bonding portion 313 includes plurality of contact surfaces 312a or 313a, and in the light reflection member attachment step (S5), plurality of contact surfaces 312a or 313a overlap the overlap region.

With this manufacturing method, light reflection member 30 is thermocompression-bonded to solar cell 10 by plurality of contact surfaces 312a or 313a, in the overlap regions where solar cell 10 overlaps light reflection member 30. Accordingly, light reflection member 30 is unlikely to separate from compression bonding head 310 when compression bonding head 310 adsorbs light reflection member 30 on preparation table 91 and moves to placement region R1.

In the method of manufacturing solar cell module 1 according to Embodiment 3, in the light reflection member attachment step (S5), plurality of contact surfaces 312a and 313a overlap the overlap region at both ends of the overlap region.

With this manufacturing method, light reflection member 30 is thermocompression-bonded to solar cell 10 by plurality of contact surfaces 312a or 313a, at both ends of the overlap region where solar cell 10 overlaps light reflection member 30. Accordingly, light reflection member 30 is more unlikely to separate from compression bonding head 310 when compression bonding head 310 adsorbs light reflection member 30 on preparation table 91 and moves to placement region R1. The placement of light reflection member 30 in placement region R1 can be further ensured in this way.

In particular, the corner parts of light reflection member 30 are attached to solar cells 10 in the light reflection member attachment step (S5). When the corner parts of light reflection member 30 are attached to solar cells 10, light reflection member 30 is unlikely to peel off solar cells 10.

The method of manufacturing solar cell module 1 according to Embodiment 3 further includes: the light reflection member preparation step (S3) of setting plurality of light reflection members 30 including light reflection member 30 on plurality of movable tables 401 in a one-to-one correspondence, before the light reflection member placement step (S4); and the movement step (S11) of adjusting an interval between adjacent two light reflection members 30 by adjacent two movable tables 401 according to an interval between plurality of placement regions R1 each of which is situated across the gap between adjacent two solar cells 10 in the light reflection member placement step (S4), after the light reflection member preparation step (S3) and before the light reflection member placement step (S4).

With this manufacturing method, after plurality of light reflection members 30 are set on plurality of movable tables 401 in a one-to-one correspondence, plurality of movable tables 401 move on body portion 402 according to the interval between plurality of placement regions R1. Since plurality of light reflection members 30 are positioned by plurality of compression bonding heads 310 in a one-to-one correspondence, there is no need to accurately arrange each light reflection member 30. This eases the manufacture of solar cell module 1.

(Other Variations, Etc.)

While the solar cell module according to the present disclosure has been described above by way of Embodiments 1 to 3 and their variations, the present disclosure is not limited to Embodiments 1 to 3 and their variations described above.

For example, although the compression bonding heads are arranged in a line at approximately regular intervals in the column direction in the foregoing Embodiment 1, the compression bonding heads may be arranged orthogonally to the column direction. In other words, the compression bonding heads may be arranged in the row direction. Here, in the case where three or more solar cell strings are arranged, the compression bonding heads may move in the row direction while sequentially thermocompression-bonding light reflection members.

In the foregoing Embodiment 1, five first support portions having 60 compression bonding heads may be provided to correspond to each placement region of the adjacent two solar cells in six solar cell strings. In this case, the light reflection member placement step and the light reflection member attachment step can be performed all at once on the six solar cell strings that have undergone the pressing step.

In the foregoing embodiments, the light reflection member may be placed on the front surface side of each solar cell.

In this case, the light reflection member is placed so that the concavo-convex portion of the insulation member faces upward, and the surface opposite to the concavo-convex portion of the insulation member is adhered to the front surface of the solar cell by the resin adhesive. Thus, the light reflection member in FIG. 4 may be placed symmetrically with respect to the plane defined by the X-axis direction and the Y-axis direction.

Although two light reflection members are provided on each solar cell except the solar cells of the outermost strings in the foregoing embodiments, this is not a limitation. For example, two light reflection members may be provided on each of all solar cells. The number of light reflection members provided on one solar cell is not limited to two, and may be one or three or more. For example, a light reflection member may be provided at each of the four sides of the solar cell, and a plurality of light reflection members may be provided at each of the four sides of the solar cell.

In the foregoing embodiments, the light reflection member may be attached above or below the wiring material connecting the adjacent two solar cells. In this case, the concavo-convex portion of the light reflection member may be approximately orthogonal to the wiring material.

Although the semiconductor substrate of the solar cell is an n-type semiconductor substrate in the foregoing embodiments, the semiconductor substrate may be a p-type semiconductor substrate.

Although the solar cell module is double-surface light reception type in which both the front surface protection member and the back surface protection member are a light receiving surface in the foregoing embodiments, this is not a limitation. For example, the solar cell module may be one-surface light reception type in which only one of the front surface protection member and the back surface protection member (e.g. front surface protection member) is a light receiving surface. In the case of one-surface light reception type, the p-side electrode need not be transparent, and may be; for example, a metal electrode having reflectivity.

Although the semiconductor material of the photoelectric conversion portion in the solar cell is silicon in the foregoing embodiments, this is not a limitation. The semiconductor material of the photoelectric conversion portion in the solar cell may be gallium arsenide (GaAs), indium phosphide (InP), or the like.

Other modifications obtained by applying various changes conceivable by a person skilled in the art to Embodiments 1 to 3 and their variations and any combinations of the structural elements and functions in Embodiments 1 to 3 and their variations without departing from the scope of the present disclosure are also included in the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What claimed is:

1. A method of manufacturing a solar cell module, comprising:
   placing a light reflection member across a gap between adjacent two solar cells set on a work table;
   attaching the light reflection member to respective ends of the adjacent two solar cells, by thermocompression-bonding respective overlap regions of the light reflection member with the adjacent two solar cells using a compression bonding head, the compression bonding head including two thermocompression bonding portions each having a contact surface that comes into contact with the light reflection member, and a non-thermocompression bonding portion interposed between the two thermocompression bonding portions, the two thermocompression portions for thermocompression bonding the light reflection member to the adjacent two solar cells; and the non-thermocompression bonding portion does not thermocompression bond the light reflection member to any element;
   setting a plurality of light reflection members including the light reflection member on a plurality of movable tables in a one-to-one correspondence, before the placing; and
   adjusting an interval between adjacent two light reflection members by adjacent two movable tables according to an interval between a plurality of placement regions each of which is situated across the gap between the adjacent two solar cells in the placing, after the setting and before the placing,
   wherein the respective overlap regions of the light reflection member are thermocompression-bonded with the adjacent two solar cells via the two thermocompression bonding portions.

2. The method of manufacturing a solar cell module according to claim 1,
   wherein in the attaching, the light reflection member is attached to the respective ends of the adjacent two solar cells by placing the compression bonding head in a state where, in a planar view of the adjacent two solar cells, the two thermocompression bonding portions overlap the respective overlap regions and the non-thermocompression bonding portion overlaps a region of the gap between the adjacent two solar cells.

3. The method of manufacturing a solar cell module according to claim 1,
   wherein each of the two thermocompression bonding portions further has a noncontact surface that does not come into contact with a corresponding one of the overlap regions, and
   in the attaching, each of the two thermocompression bonding portions thermocompression-bonds a part of the overlap region, while the non-thermocompression bonding portion keeps a remaining part of the overlap region from being thermocompression-bonded.

4. The method of manufacturing a solar cell module according to claim 3,
   wherein the contact surface in each of the two thermocompression bonding portions includes a plurality of contact surfaces, and
   in the attaching, the plurality of contact surfaces overlap the overlap region.

5. The method of manufacturing a solar cell module according to claim 4,
   wherein in the attaching, the plurality of contact surfaces overlap the overlap region at both ends of the overlap region.

6. The method of manufacturing a solar cell module according to claim 1, further comprising, before the placing:
   forming a solar cell string by connecting a plurality of solar cells linearly arranged in a row direction by a wiring material, the plurality of solar cells including any of the adjacent two solar cells; and pressing each of the plurality of solar cells in the solar cell string formed in the forming, by a pressing portion, wherein the pressing is continuously performed between the placing and the attaching.

7. The method of manufacturing a solar cell module according to claim 6, wherein in the pressing, the plurality of solar cells are sequentially pressed by the pressing portion in the row direction of the solar cell string.

8. The method of manufacturing a solar cell module according to claim 6, further comprising:

stacking a light-transmitting substrate, a resin sheet, and the solar cell string in the stated order to form a stack body and thermocompression-bonding the stack body, after the attaching.

9. The method of manufacturing a solar cell module according to claim 1, wherein the compression bonding head has a suction hole for adsorbing the light reflection member, and in the placing, the light reflection member is adsorbed to the suction hole and placed across the gap between the adjacent two solar cells.

10. The method of manufacturing a solar cell module according to claim 1, wherein each of the two thermocompression bonding portions has an elastic portion that comes into contact with the light reflection member.

11. The method of manufacturing a solar cell module according to claim 1, wherein the compression bonding head extends parallel to a lengthwise direction of the light reflection member, and has a groove portion formed by the non-thermocompression bonding portion being recessed with respect to the two thermocompression bonding portions, the groove portion extending parallel to the lengthwise direction.

12. The method of manufacturing a solar cell module according to claim 1, wherein the compression bonding head is a roller, and includes: an annular first thermocompression bonding portion on an outer peripheral surface of the roller; an annular second thermocompression bonding portion on the outer peripheral surface; and an annular groove on the outer peripheral surface, between and annularly recessed relative to the annular first thermocompression bonding portion and the annular second thermocompression bonding portion.

13. A method of manufacturing a solar cell module, comprising:

forming a solar cell string by connecting a plurality of solar cells linearly arranged in a row direction by a wiring material, the plurality of solar cells including any of the adjacent two solar cells; and pressing each of the plurality of solar cells in the solar cell string formed in the forming, by a pressing portion placing a light reflection member across a gap between, among the plurality of solar cells, adjacent two solar cells set on a work table; and attaching the light reflection member to respective ends of the adjacent two solar cells, by thermocompression-bonding respective overlap regions of the light reflection member with the adjacent two solar cells using a compression bonding head, the compression bonding head including two thermocompression bonding portions each having a contact surface that comes into contact with the light reflection member, and a non-thermocompression bonding portion interposed between the two thermocompression bonding portions, the two thermocompression portions for thermocompression bonding the light reflection member to the adjacent two solar cells; and the non-thermocompression bonding portion does not thermocompression bond the light reflection member to any element; and stacking a light-transmitting substrate, a resin sheet, and the solar cell string, a back surface side resin sheet, and a back surface protection member in the stated order to form a stack body and thermocompression-bonding the stack body, after the attaching, wherein the pressing is continuously performed between the placing and the attaching.

* * * * *